(12) United States Patent
Inaba et al.

(10) Patent No.: US 7,275,197 B2
(45) Date of Patent: *Sep. 25, 2007

(54) TESTING APPARATUS

(75) Inventors: Kenji Inaba, Tokyo (JP); Masashi Miyazaki, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/048,632

(22) Filed: Feb. 1, 2005

(65) Prior Publication Data

US 2005/0240852 A1  Oct. 27, 2005

Related U.S. Application Data

(63) Continuation of application No. PCT/JP2004/018069, filed on Nov. 26, 2004, and a continuation of application No. 10/773,562, filed on Feb. 6, 2004.

(60) Provisional application No. 60/525,786, filed on Nov. 26, 2003.

(51) Int. Cl.
*G01R 31/28* (2006.01)
*G06F 11/00* (2006.01)
*G01R 27/28* (2006.01)

(52) U.S. Cl. ............... 714/740; 714/707; 714/744; 702/117

(58) Field of Classification Search ............... None
See application file for complete search history.

(56) References Cited

U.S. PATENT DOCUMENTS 4,707,834 A  11/1987  Frisch et al.
6,028,439 A  2/2000  Arkin et al.
2004/0177303 A1*  9/2004  Miura ............... 714/741
2005/0114550 A1*  5/2005  Kushnik ............... 709/248
2005/0240852 A1*  10/2005  Inaba et al. ............... 714/740

FOREIGN PATENT DOCUMENTS

GB  2195029  3/1988

(Continued)

OTHER PUBLICATIONS

International Search Report for PCT/JP2004/018069 mailed on Mar. 17, 2005, 3 pages.

(Continued)

*Primary Examiner*—Phung My Chung
(74) *Attorney, Agent, or Firm*—Osha Liang LLP

(57) ABSTRACT

A testing apparatus including a plurality of testing module slots to which different types of testing modules for testing a device under test are optionally mounted, includes an operation order holding unit for holding information indicating that a test operation by a first testing module should be performed before a test operation by a second testing module, a trigger return signal receiving unit for receiving a trigger return signal from the first testing module, the trigger return signal indicating that the first testing module has completed the test operation thereof, when the test operation of the first testing module has been completed, and a trigger signal supplying unit for supplying a trigger signal to the second testing module, the trigger signal indicating that the second testing module should start the test operation thereof, when the trigger return signal receiving unit receives the trigger return signal.

3 Claims, 21 Drawing Sheets

FOREIGN PATENT DOCUMENTS

| | | |
|---|---|---|
| JP | 10-239396 | 9/1998 |
| JP | 2001-174526 | 6/2001 |
| JP | 2002-528706 | 9/2002 |
| JP | 2003-217299 | 7/2003 |

OTHER PUBLICATIONS

Japanese Office Action "Notification of Reasons for Refusal" issued in Japanese Application No. 2006-526016 mailed on Feb. 6, 2007 and English translation thereof, 6 pages.

* cited by examiner

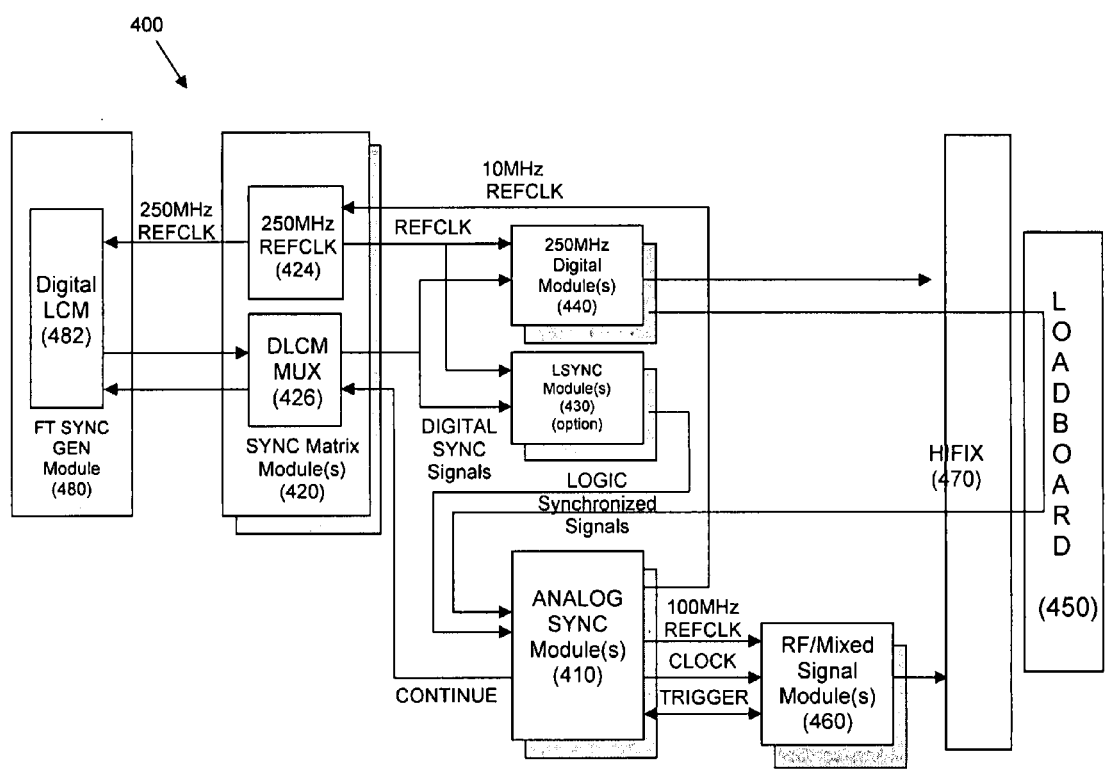
Figure 3.1

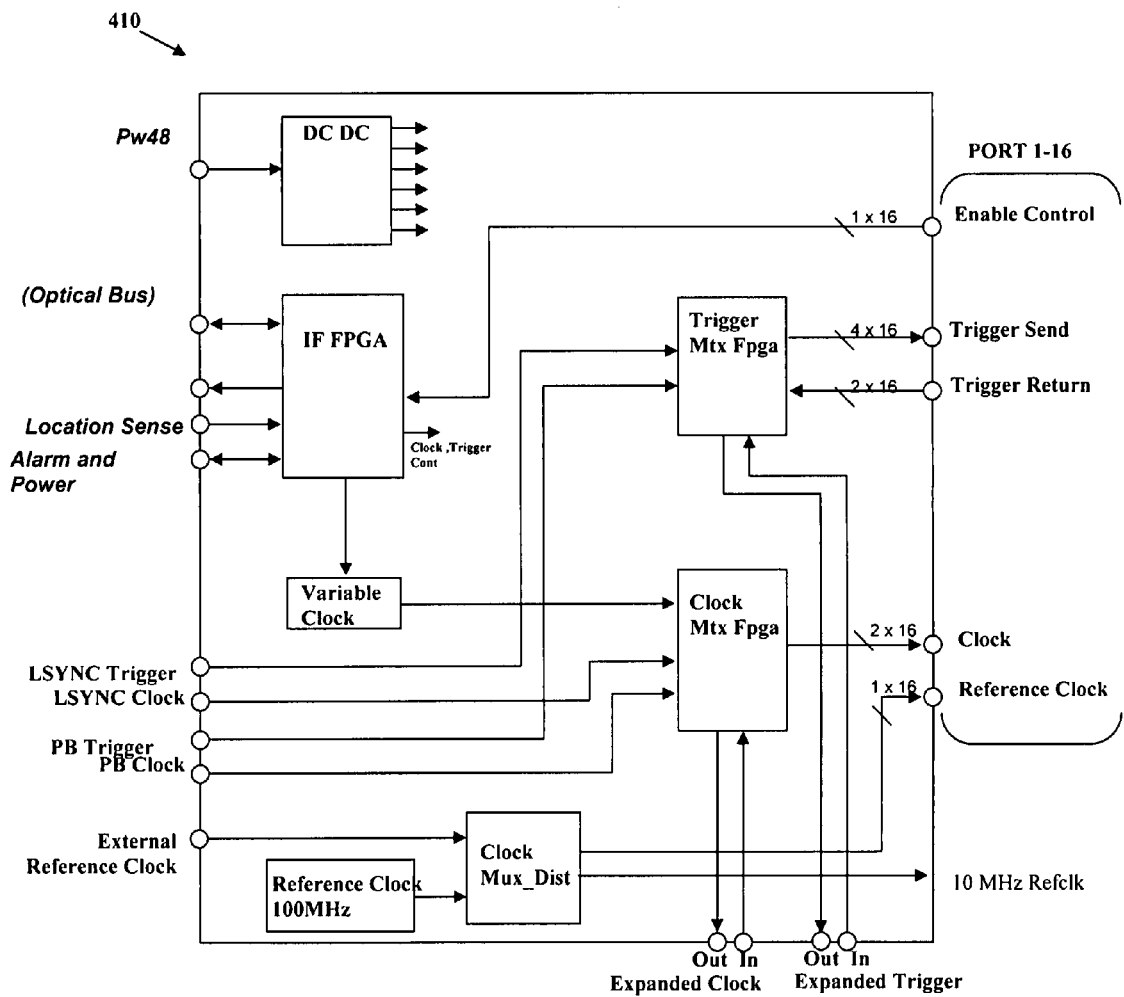
Figure 3.2

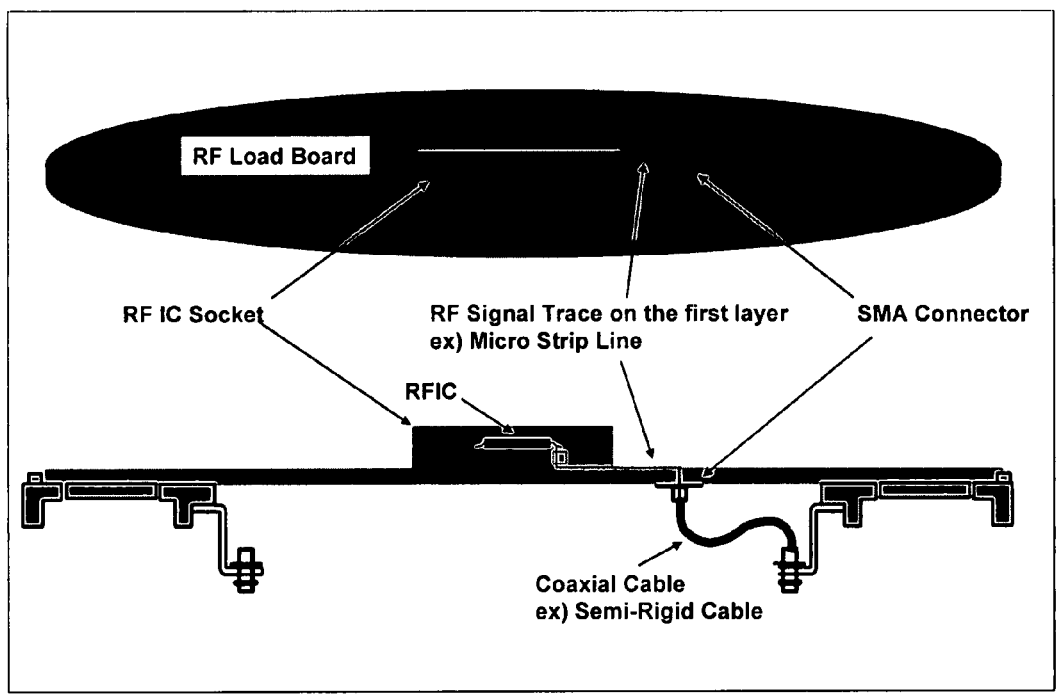
Figure 4.1 Pictorial view of Exemplary RF Load Board

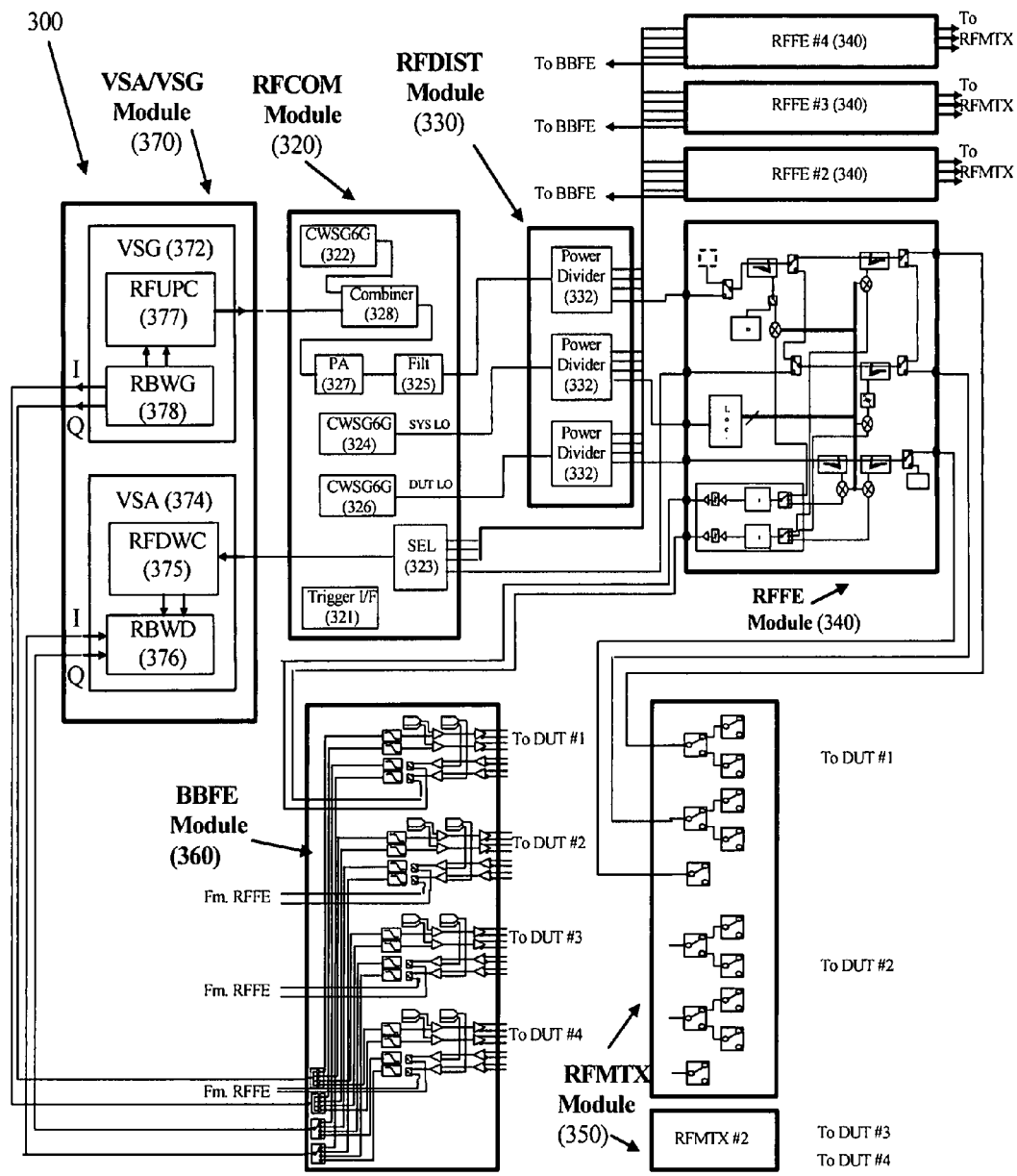
Fig 5.1

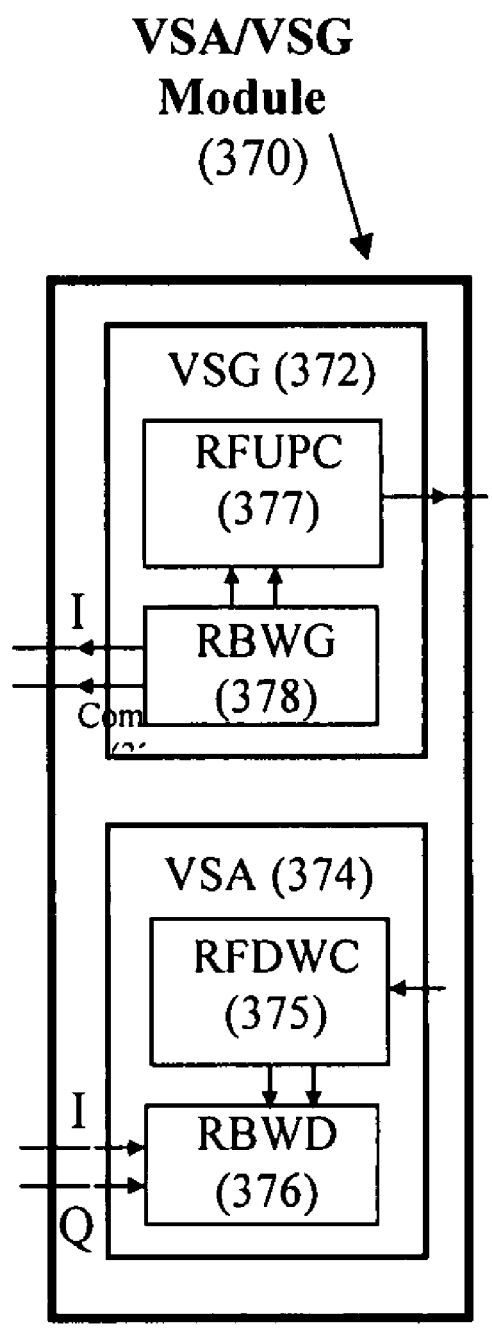
Figure 5.2

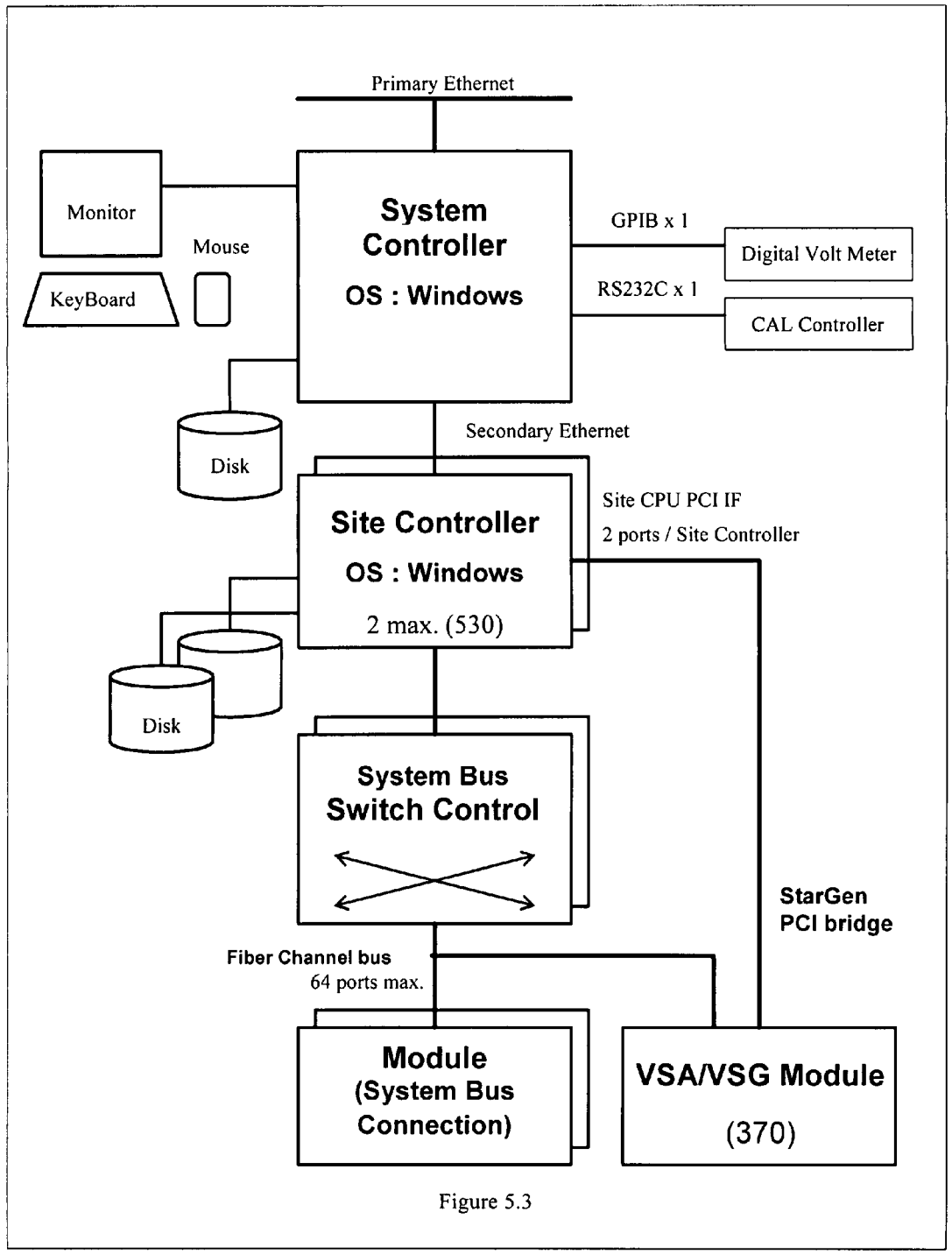
Figure 5.3

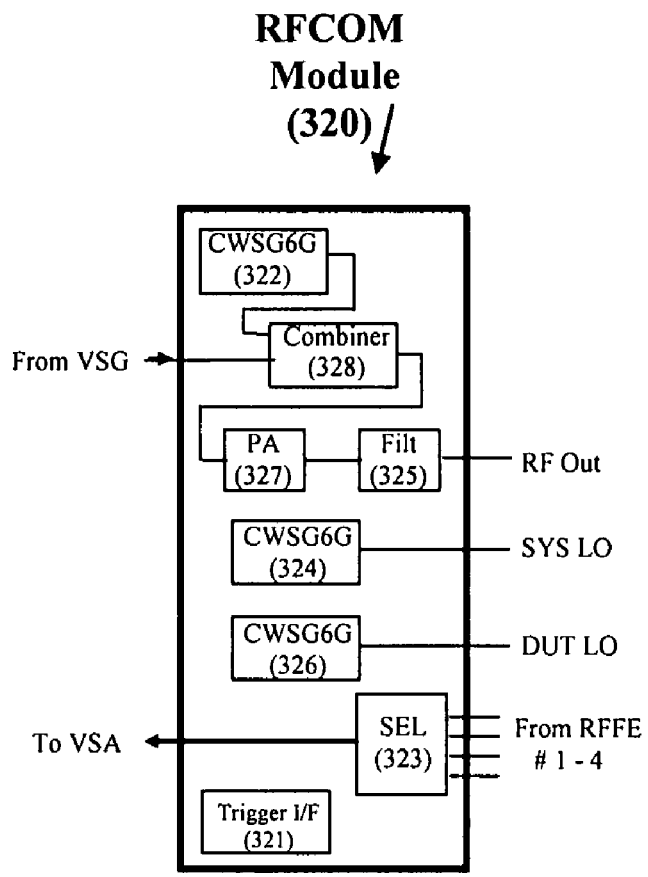
Figure 5.4

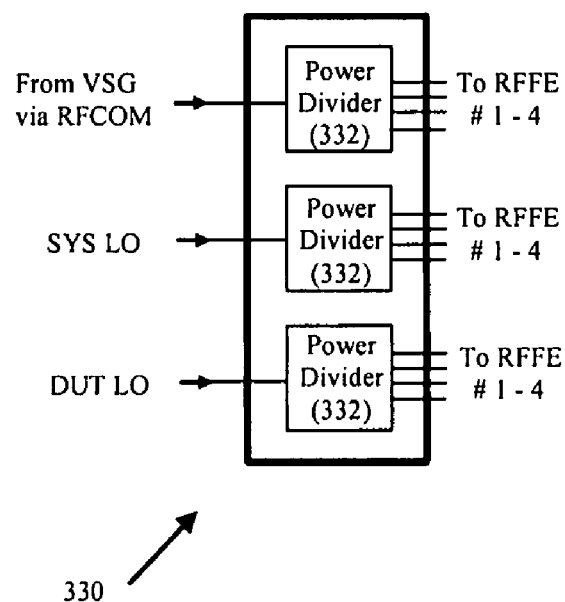
Figure 5.5

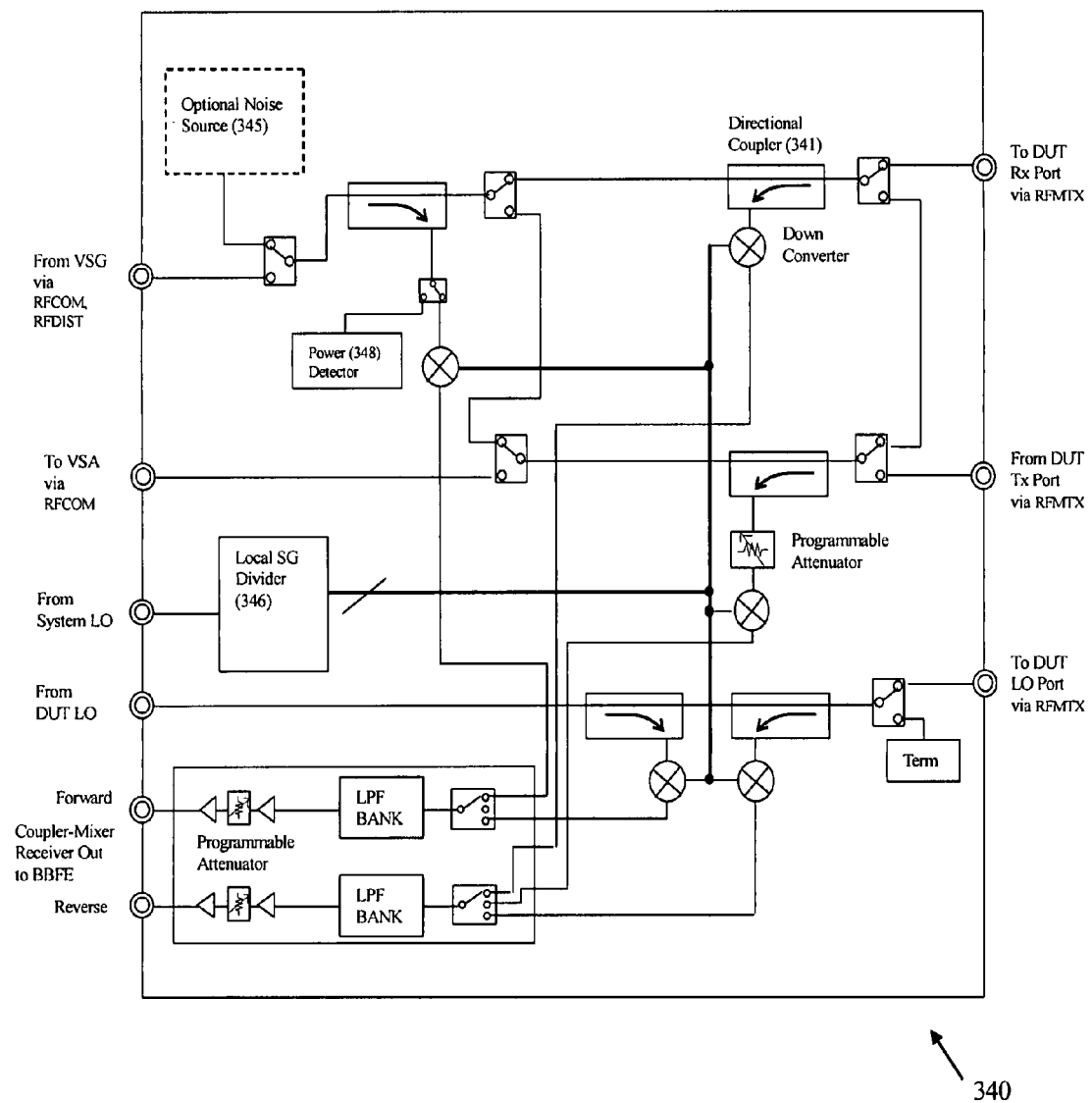
Figure 5.6

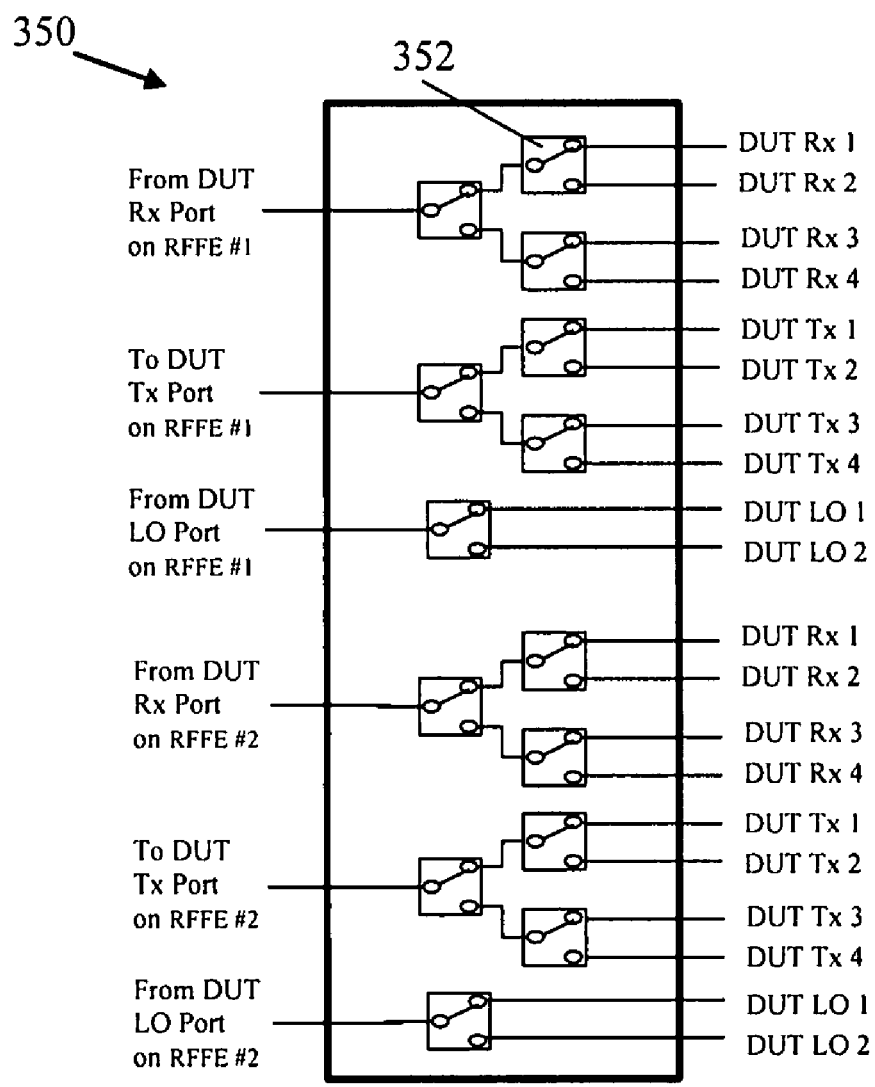
Figure 5.7

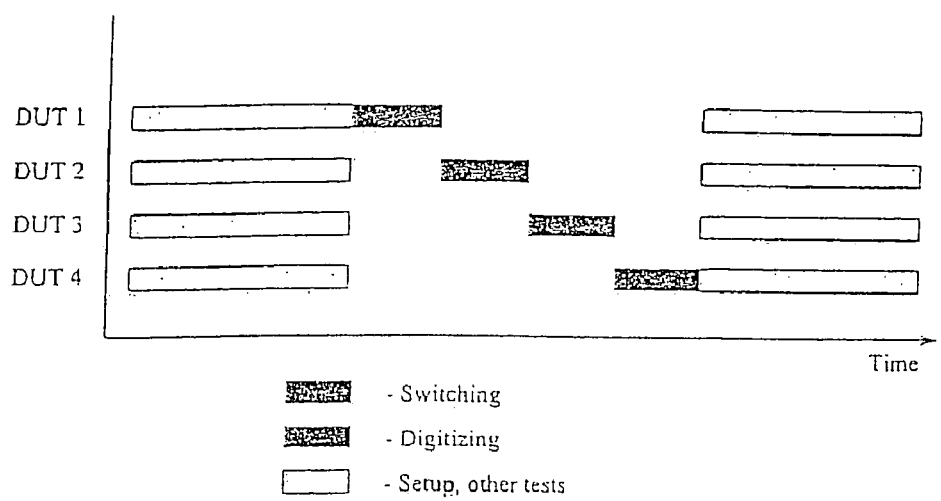
Figure 5.8

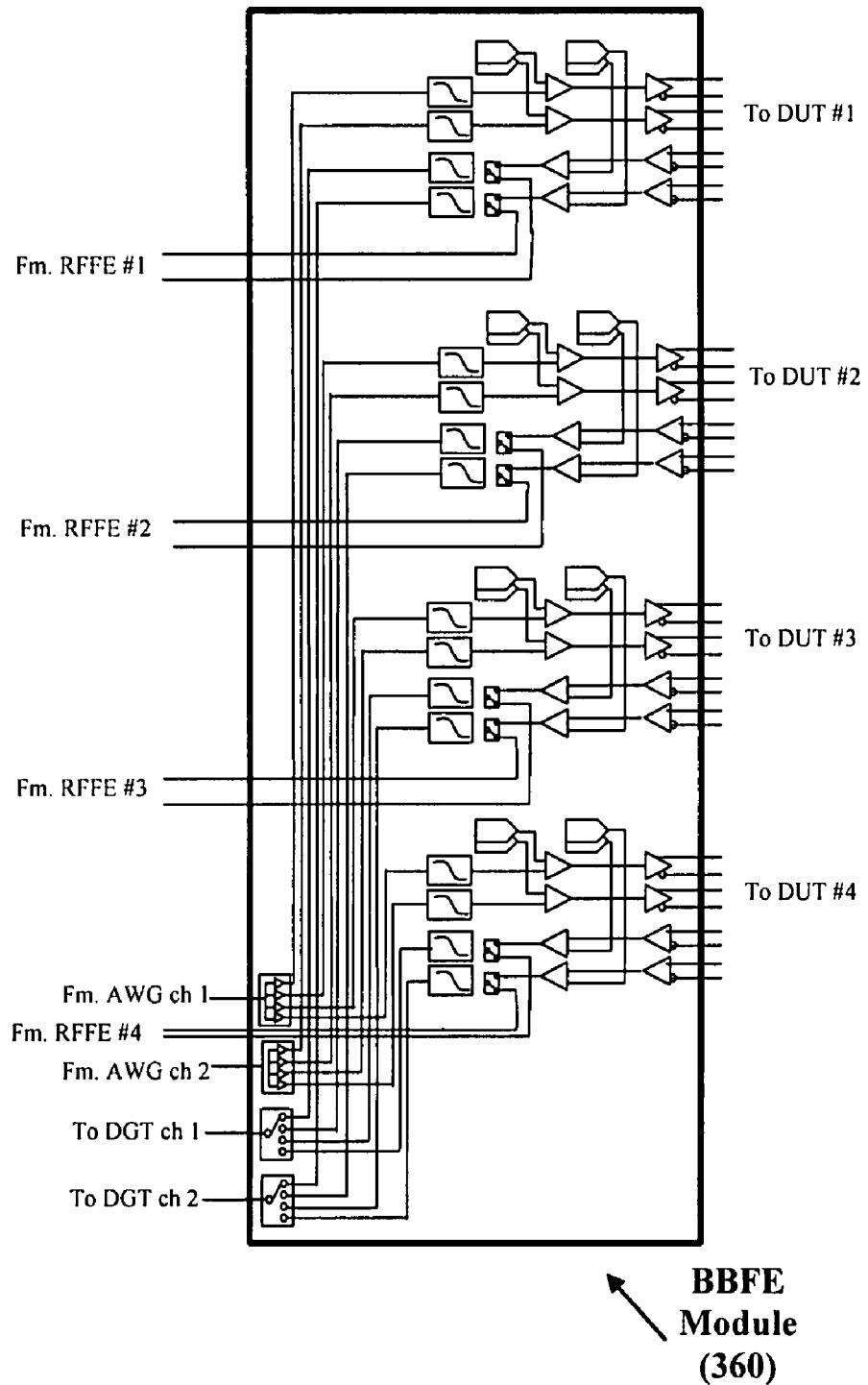
Figure 6.1

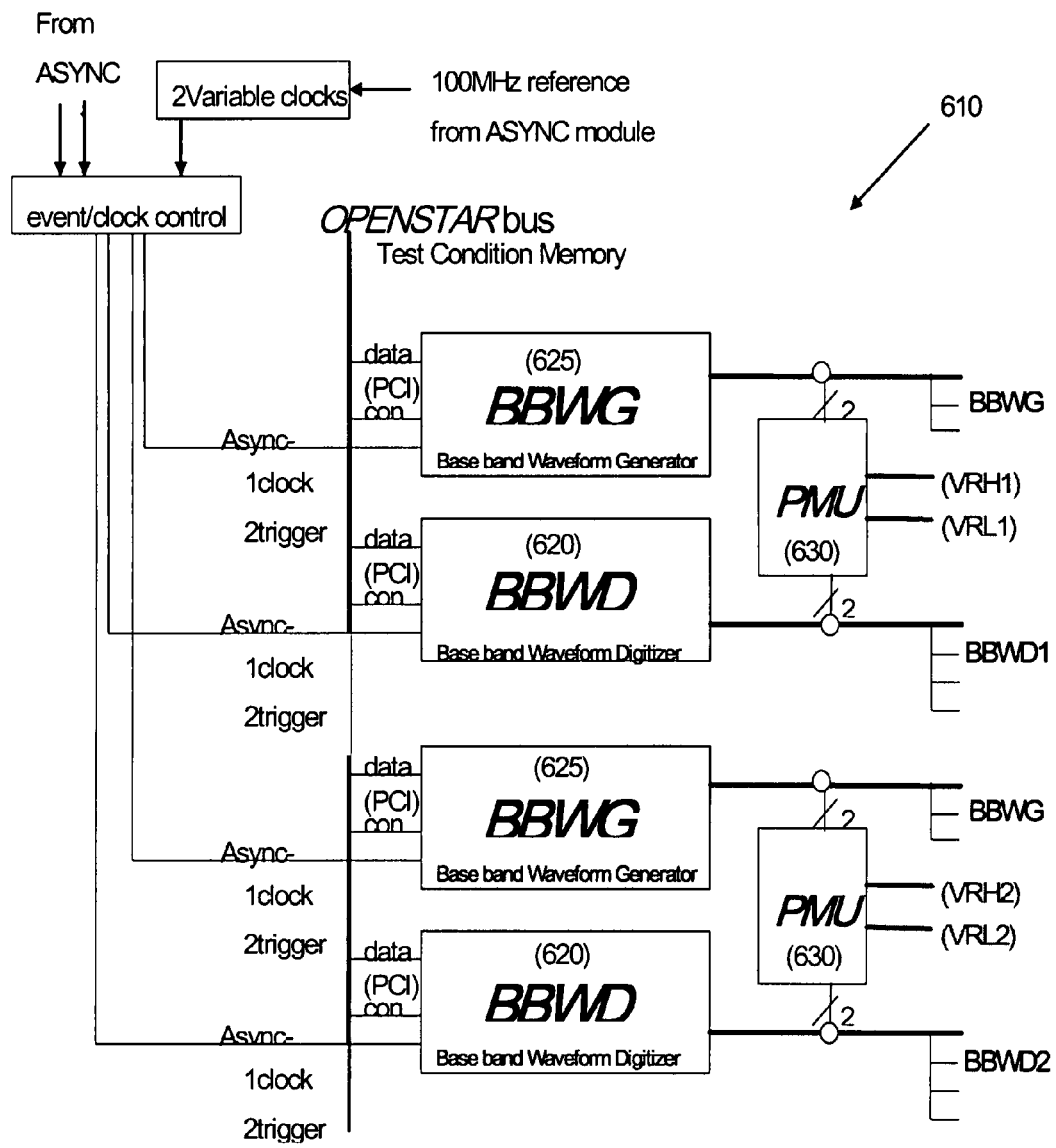
Figure 7.1

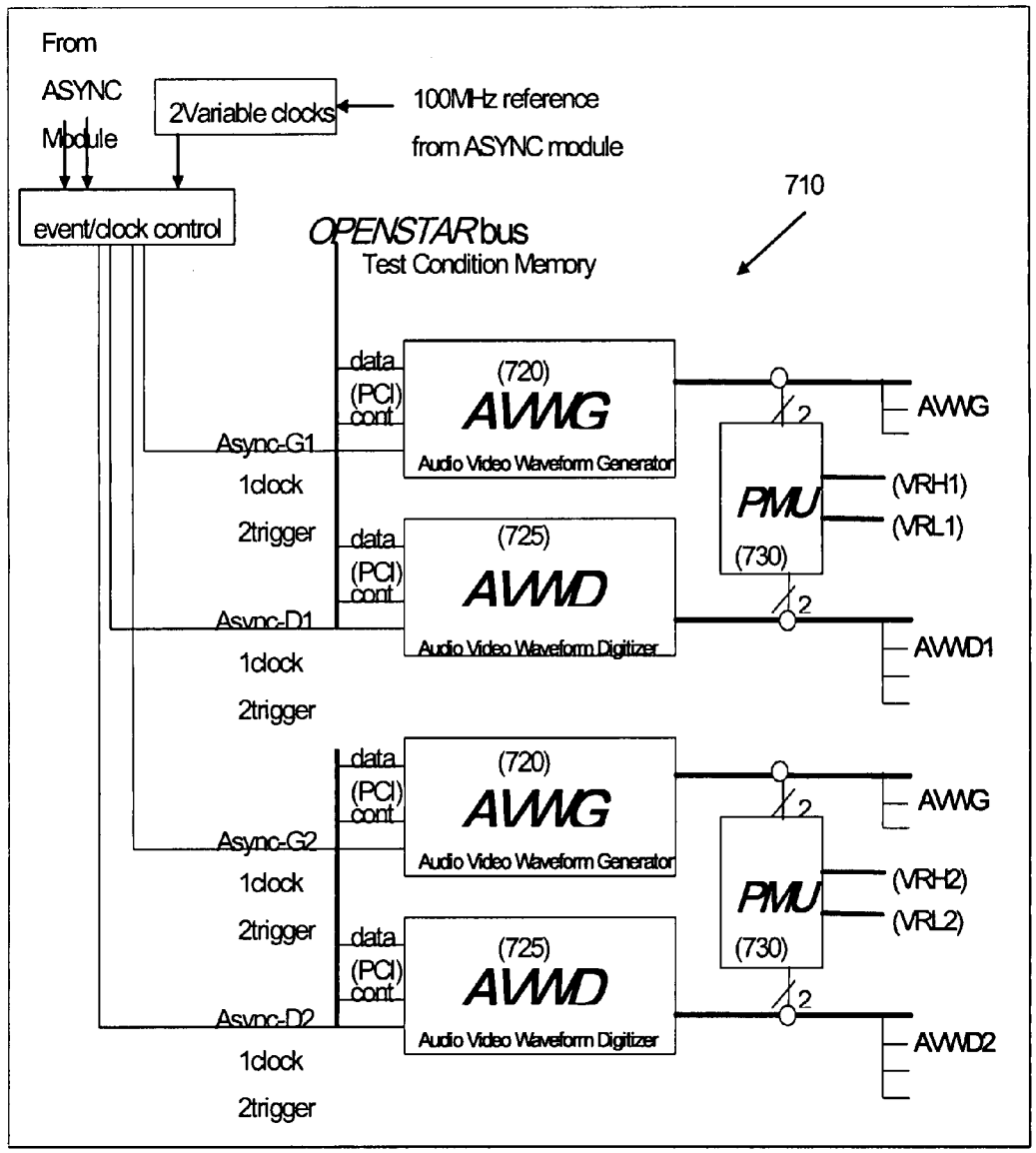
Figure 8.1

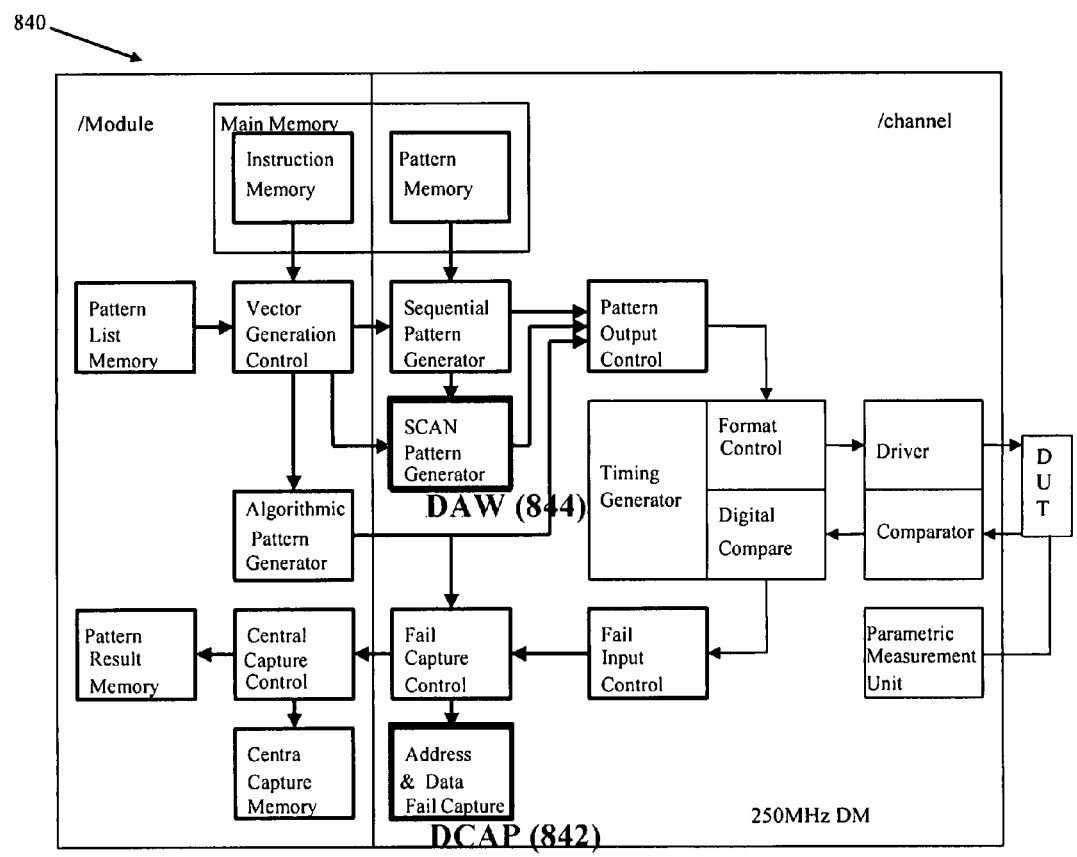
Figure 9.1

TESTING APPARATUS

BACKGROUND OF THE INVENTION

1. Field of the Invention

The present invention relates to a testing apparatus. More particularly, the present invention relates to a testing apparatus including a plurality of testing module slots to which different types of testing modules are optionally mounted.

2. Description of the Related Art

A testing apparatus for performing an analog test of a device under test performs the test by allowing one testing module to generate and supply a test signal to the device under test and another testing module to measure the output signal from the device under test. In order to realize the operations of such testing modules, the testing apparatus controls the testing modules synchronously, while supplying trigger signals to them based on a testing program which determines test sequences such as the operation order of the testing modules.

Recently, a testing apparatus including a plurality of testing module slots to which different types of testing modules for generating different types of test signals for the test of the device under test respectively are optionally mounted has been developed. In such testing apparatus, since the testing modules mounted to the plurality of testing module slots respectively are optionally changed, and the times required for the test operations for the test modules are different from each other, it is inevitable to make a testing program which corresponds to the mounting positions or the combination of the testing modules whenever the testing modules are changed, and it is necessary to prepare a process for a extremely difficult test.

SUMMARY OF THE INVENTION

Therefore, it is an object of the present invention to provide a testing apparatus, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a testing apparatus including a plurality of testing module slots to which different types of testing modules for testing a device under test are optionally mounted, includes operation order holding means for holding information indicating that a test operation by a first testing module among the plurality of testing modules should be performed before a test operation by a second testing module among the plurality of testing modules, trigger return signal receiving means for receiving a trigger return signal from the first testing module, the trigger return signal indicating that the first testing module has completed the test operation thereof, when the test operation of the first testing module has been completed, and trigger signal supplying means for supplying a trigger signal to the second testing module, the trigger signal indicating that the second testing module should start the test operation thereof, when the trigger return signal receiving means receives the trigger return signal.

The first testing module may be an arbitrary waveform adjustor for generating and supplying an arbitrary analog waveform to the device under test, the second testing module may be a phase characteristics tester for receiving an analog waveform outputted by the device under test in response to the analog waveform supplied from the arbitrary waveform adjustor, and testing phase characteristics of the analog waveform, the operation order holding means may hold information indicating that the phase characteristics tester should perform a receiving operation of the analog waveform from the device under test, after the arbitrary waveform adjustor performs a supply operation of the analog waveform to the device under test, the trigger return signal receiving means may receive the trigger return signal from the arbitrary waveform adjustor, the trigger return signal indicating that the arbitrary waveform adjustor has completed the supply operation, when the supply operation at a predetermined time of the analog waveform has completed by the arbitrary waveform adjustor, and the trigger signal supplying means may supply the trigger signal to the phase characteristics tester, the trigger signal indicating that, the phase characteristics tester should start the receiving operation of the analog waveform from the device under test, when the trigger return signal receiving means receives the trigger return signal.

The trigger return signal receiving means and the trigger signal supplying means may be a multiplexer circuit for obtaining each of a plurality of the trigger return signals from each of the plurality of testing modules, selecting one of the trigger return signals obtained from the first testing module, and supplying the selected trigger return signal to the second testing module as the trigger signal, and the operation order holding means may be a flip-flop circuit for holding a select signal for controlling the multiplexer circuit to select the trigger return signal.

The first testing module may perform first and second test operations in parallel, the operation order holding means may hold information indicating that the test operation by the second testing module should be performed after the first test operation by the first testing module, and information indicating that a test operation by a third testing module among the plurality of testing modules should be performed after the second test operation by the first testing module, the trigger return signal means may receive a first trigger return signal from the first testing module, the first trigger return signal indicating that the first testing module has completed the first test operation, when the first test operation of the first testing module has been completed, and a second trigger return signal from the first testing module, the second trigger return signal indicating that the first testing module has completed the second test operation, when the second test operation of the first testing module has been completed, and the trigger signal supplying means may supply a first trigger signal to the second testing module, the first trigger signal indicating that the second testing module should start the test operation thereof, when the trigger return signal receiving means receives the first trigger return signal, and a second trigger signal to the third testing module, the second trigger signal indicating that the third testing module should start the test operation thereof, when the trigger return signal receiving means receives the second trigger return signal.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3.1 is an example system synchronization block diagram

FIG. 3.2 is an example ASYNC module block diagram

FIG. 4.1 is a pictorial view of exemplary RF load board

FIG. 5.1 is an example RF instrument showing modules for 4 DUT parallel testing FIG. 5.2 is an example VSA/VSG module FIG. 5.3 is a computing architecture: VSA/VSG bus connection FIG. 5.4 is an example RFCOM module block diagram FIG. 5.5 is an example RFDIST block diagram FIG. 5.6 is an example block diagram of RFFE (RF front end)

FIG. 5.7 is an example RFMTX block diagram

FIG. 5.8 is an example time analysis for sequential DUT digitizing for 4 DUTs FIG. 6.1 is an example BBFE module block diagram FIG. 7.1 is an example BBWG/D block diagram FIG. 8.1 is an example AVWG/D block diagram FIG. 9.1 is an exemplary block diagram of 250 M digital module showing DCAP and DAW

DETAILED DESCRIPTION OF THE INVENTION

The invention will now be described based on the preferred embodiments, which do not intend to limit the scope of the invention, but exemplify the invention. All of the features and the combinations of the embodiments are not necessarily essential to the invention.

The present invention is directed to a group of test head modules designed to perform RF and mixed-signal/analog testing when installed in the test head of systems such as the Semiconductor Test Consortium (STC) OPENSTAR compliant test system. These modules are designed to enable testing of devices that include, but are not limited to, W-LAN, cell phone, audio, video, disk drive, HDTV, DVD, and other RF, analog, and mixed-signal integrated circuits.

The test head modules described herein include the following:

| ASYNC | Analog Sync |
| --- | --- |
| RF Modules | |
| VSA/VSG | Vector Signal Analyzer/Vector Signal Generator |
| RF COM | RF Common |
| RF DIST | RF Distribution |
| RF FE | RF Front End |
| RF MTX | RF Switch Matrix |
| RFPA | RF Power Amplifier |
| AVWG/D | Audio Video Waveform Generator/Digitizer |
| BBWG/D | Base Band Waveform Generator/Digitizer |
| BBFE | Base Band Front end |

The following description covers exemplary architecture, physical characteristics, and specifications for each test head module. The RF modules listed above are sub instruments, designed to be interconnected to form a complete test instrument. In this case, some specifications apply only to the complete test instrument. Note that although exemplary architectures, physical characteristics, and specifications of the present invention are described for purposes of illustration and explanation, embodiments of the present invention are not limited to the examples disclosed herein.

Additionally, this document contains information on RF calibration, the mixed-signal portions of a 250 MHz digital module, computer connections to the RF subsystem, Device Interface, RF and mixed-signal software, and parallel testing.

Many test system configurations are possible using the modules described herein. An example application configuration pictured below shows the interconnection of the RF modules to form a complete RF instrument, and shows 4 DUT parallel testing, using waveform generator/digitizer modules to provide additional signals to the DUTs.

Figure 1:
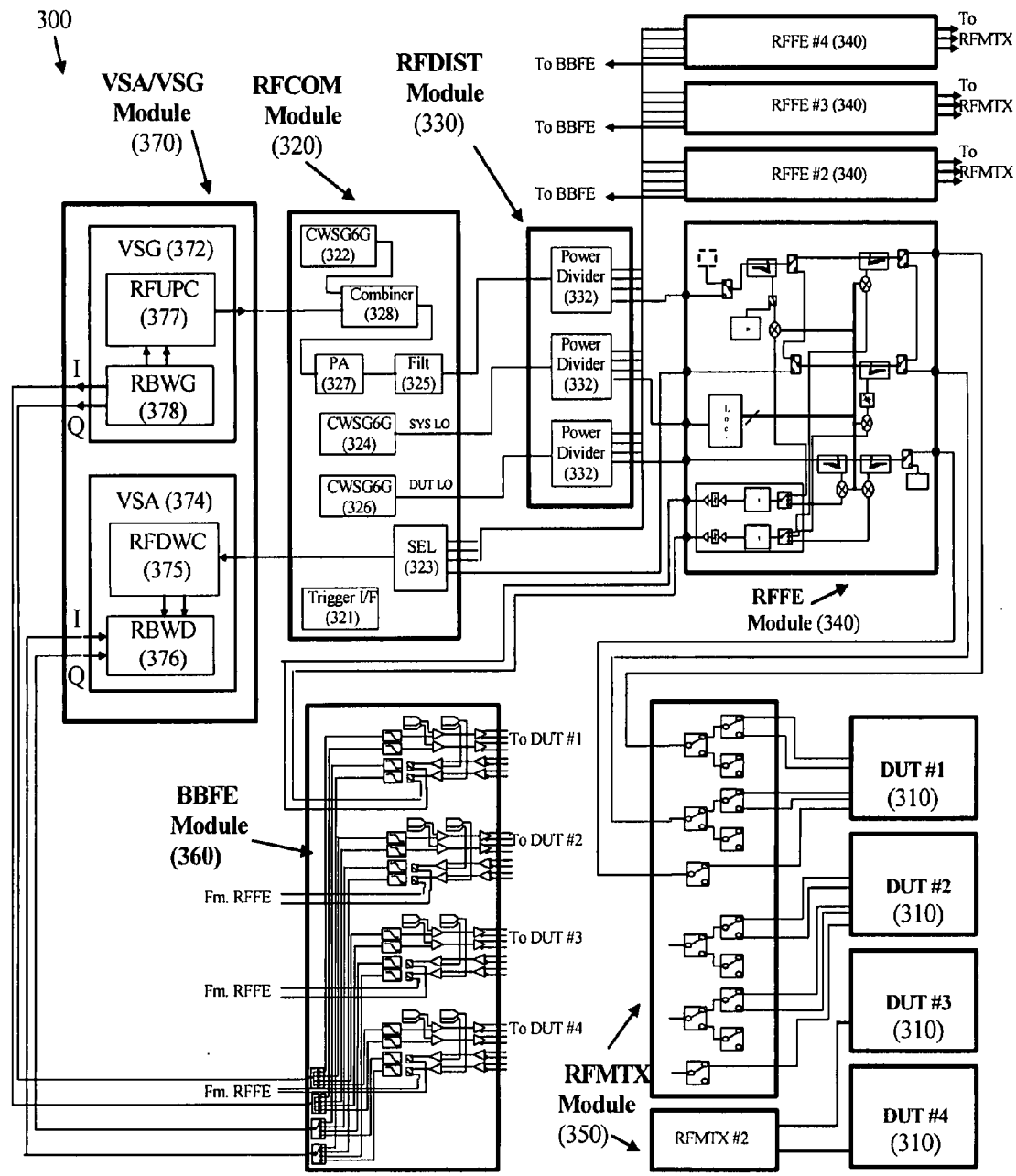
FIG. 1 is an example system block diagram

The block diagram for an example system configuration 300 is shown in FIG. 1. The system 300 is configured to test four DUTs 310, for example, multi-band cell phone RF chips. A brief description of the modules and signal flow is given below. A more detailed description of each module and its operation appears in FIGS. 5.1-6.1.

During testing, a modulated RF signal generated by the Vector Signal Generator (VSG) 372 is sent to the RFCOM module 320 where, depending on the test, it may be combined with a signal from a 6 GHz CW Signal Generator (CWSG6G) 322, amplified, and/or low pass filtered. The signal then goes to the RFDIST Module 330, where it gets distributed to four RF Front End Modules 340, one for each DUT 310. The RF Front End Modules 340 provide directional couplers (not shown) and mixers (not shown) for direct digital measurement of forward and reflected power by means of the system digitizers. A second 6 GHz CW Signal Generator (CWSG6G) 324 on the RF COM Module 320 provides the system local oscillator signal for the mixers on the RF Front End Modules 340. A third 6 GHz CW Signal Generator (CWSG6G) 326 on the RF COM Module 320 provides a local oscillator signal for the DUT 310. This signal is distributed to four RFFE 340 modules by the RFDIST module 330. Both the DUT local oscillator and modulated RF signals are sent from the RFFE module 340 to the RFMTX module 350. The RFMTX module 350 switches the modulated RF signal to one of four outputs. The RFMTX 350 also switches the DUT local oscillator signal to one of two outputs, and provides connections through the RF HIFIX (not shown) to the DUT 310. RF signals from the DUT 310 are switched by the RFMTX 350 and sent to the RFFE module 340, where they may be down-converted and sent to a digitizer (through the BBFE 360), or where they may be sent on to the Vector Signal Analyzer (VSA) 374 by way of the VSA Selector 323 on the RFCOM module 320.

Base band signals are passed through the BBFE module 360 to and from one of the waveform generator/digitizers in the test head, in this case the RBWG/D (377, 376) on the VSG/VSA module 370.

Figure 2:
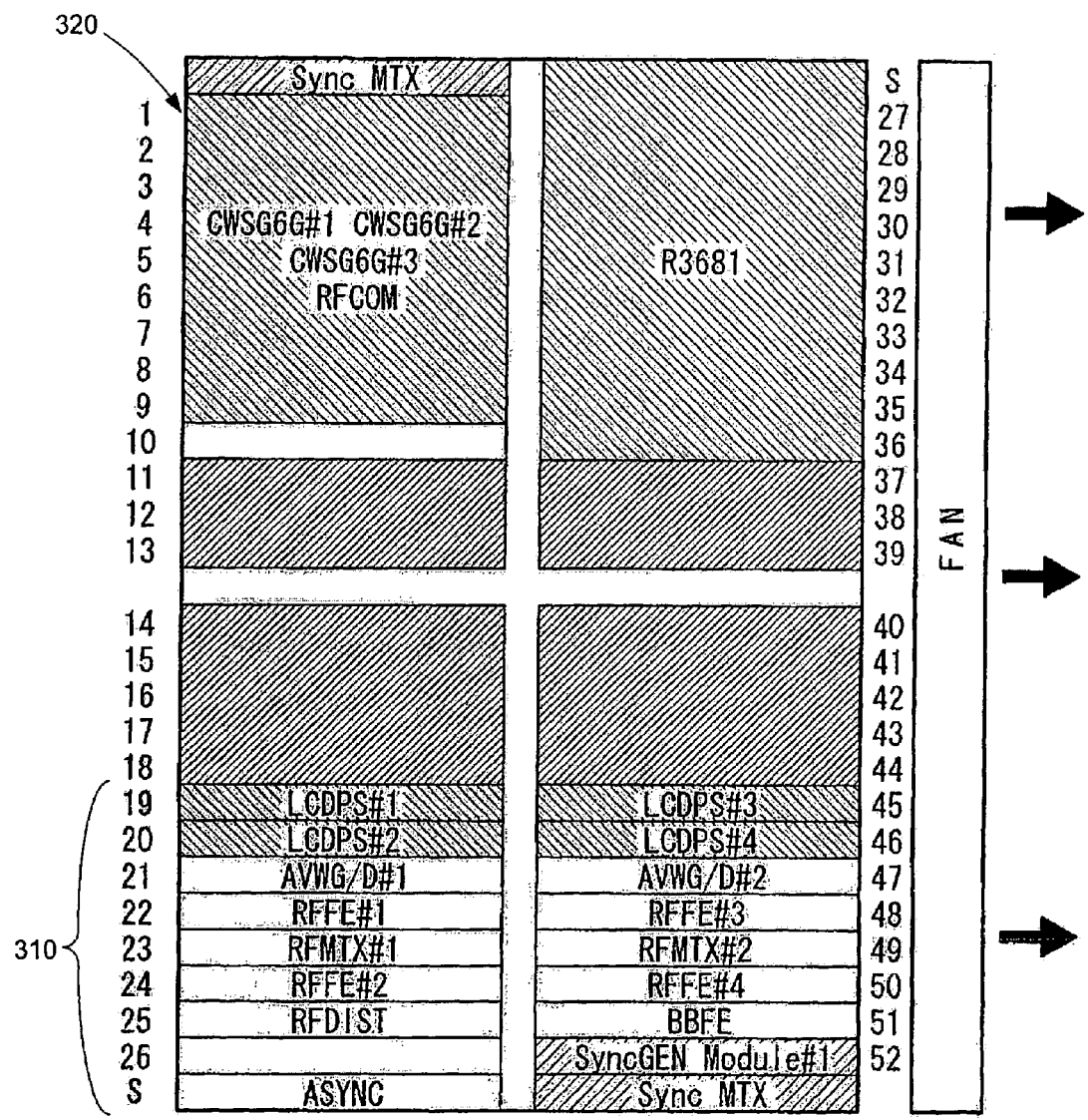
FIG. 2 is an example test head layout for 4 DUT testing

FIG. 2 shows a possible test head module layout for testing four DUTs 310 in parallel, where each DUT 310 may require RF, base band, digital, and audio frequency input and output signals. This configuration could be used for the example system 300 pictured in FIG. 1.

In one embodiment of the present invention, the VSG/VSA Module 370 requires 11 physical test head slots. (A single physical test head slot is 24 mm wide, as defined by the STC OPENSTAR Architecture Specification.) In other embodiments, the RF COM Module 320 requires 9 physical test head slots. Both of these modules are comprised of sub-modules mounted in chassis that fit into the test head. The other modules shown each require one 24 mm test head slot.

The analog sync, or ASYNC, module synchronizes the RF and analog modules in the system by means of trigger and clock lines that are connected to each module. Additionally, the ASYNC module synchronizes the RF and analog modules with the digital subsystem. The analog sync module also supplies a low phase noise reference clock to the entire system.

In embodiments of the present invention, each ASYNC Module must have its own site controller. In embodiments of the present invention, up to two ASYNC Modules may be connected together in the test head. In embodiments of the present invention, additional ASYNC modules or pairs of modules must operate independently.

FIG. 3.1 shows an example system synchronization block diagram 400. Each analog sync module 410 can control up to 16 RF/analog modules 460. It can also synchronize with the digital modules 440 through the pattern CONTINUE input on the Sync Matrix 420, and by means of logic synchronized signals from the optional LSYNC Module 430 or from the digital modules 440, connected through the performance board 450.

The analog sync module 410 contains a low phase noise 100 MHz reference clock (not shown). When the ASYNC Module 410 is present in a system, this reference becomes the master reference for the entire system. The 100 MHz reference clock is sent directly to all the RF/analog modules 460. In addition, a 10 MHz reference clock (not shown) derived from the 100 MHz reference is sent to the SYNC Matrix Modules 420 to control the 250 MHz reference clock 424 on these modules 420.

An exemplary block diagram of the ASYNC Module 410 is shown in FIG. 3.2. Table 3.1 shows the number of clock and trigger lines that are connected to each RF/analog module 460.

TABLE 3.1

Number of Clock and Trigger Lines to Each RF/Analog Module

| | |
|---|---|
| ANALOG REFERENCE CLOCK | 1 |
| ANALOG CLOCK | 2 |
| ANALOG TRIGGER SEND | 4 |
| ANALOG TRIGGER RETURN | 2 |
| CONTROL SIGNAL | 1 |

The ASYNC module contains a 1 KHz to 500 MHz variable clock source that is available to all the RF/analog modules. Pattern controlled clocks can be generated through the LSYNC clock connection.

Table 3.2 lists the exemplary ASYNC Module specifications.

TABLE 3.2

Example ASYNC Module Specifications

| Feature | Specification | Details |
|---|---|---|
| Reference CLOCK | | |
| Frequency | 100 MHz | |
| Frequency stability | <±1 ppm | |
| Phase noise | −140 dBc/Hz @ 10 kHz | |
| Variable CLOCK | | |
| Frequency range | 1 kHz to 500 MHz | |
| Frequency resolution | <1 Hz | |

TABLE 3.2-continued

Example ASYNC Module Specifications

| Feature | Specification | Details |
|---|---|---|
| Spurious level | −60 dBc | |
| Phase noise | −90 dBc/Hz @ 10 kHz | |
| Number of CLOCK/TRIGGER Ports | 16 | |

Most of the analog modules connect to the DUT through the same type of connections on the HIFIX and Load Board as used by the digital modules. A 120 pin connector at the top of the module mates with a cable mounted connector assembly on the HIFIX. Then the signals are cabled up to a connector at the Load Board interface. (See Open Architecture Hardware Specification.)

The connection system described above is not suitable for the RF subsystem. An RF HIFIX and RF Load Board may be developed to connect the RF subsystem to a DUT. Connections are made through a series of blind mate coaxial connectors at the end of the RF module, SMA connected semi-rigid coax, blind mate coaxial connectors at the Load Board interface, and semi-rigid coax to an SMA connector near the DUT. FIG. 4.1 shows a pictorial of the RF Load Board and DUT connections.

The RF modules in Table 5.1 are connected together to form a complete RF instrument. RF calibration treats the entire instrument as a single unit (with the exception of calibration factors for the load board), since intermediate points are not always accessible for calibration. Some specifications are given for individual modules, but the complete instrument specification, given in section 5.7, defines the performance of the complete RF instrument.

TABLE 5.1

RF modules which form the complete RF instrument

| | |
|---|---|
| VSA/VSG | Vector Signal Analyzer/Vector Signal Generator |
| RF COM | RF Common |
| RF DIST | RF Distribution |
| RF FE | RF Front End |
| RF MTX | RF Switch Matrix |
| RFPA | RF Power Amplifier |

FIG. 5.1 shows the complete RF instrument. The individual modules are described below.

The VSA/VSG 170 is the Vector Signal Analyzer/Vector Signal Generator 370.

FIG. 5.2 shows an exemplary block diagram of the VSA/VSG Module 370.

The VSG 372 generates CW or modulated RF waveforms from 50 MHz to 6 GHz. The RBWG (RF Base band Waveform Generator) 378 contains two 14 bit 200 MS/s arbitrary waveform generators (not shown) to generate 1 (in phase) and Q (quadrature) base band modulation signals. The RFUPC (RF Upconverter) 377 converts the base band signals to an I/Q modulated RF waveform in the frequency range of 50 MHz to 6 GHz.

The RBWG 378 I and Q outputs are also available to send to the DUT through the BBFE module 360 (see section 6).

The VSA 374 analyzes modulated RF signals by downconverting them to IF (using the RFDWC 375, or RF Downconverter (not shown)) and digitizing them with a 14 bit 100 MS/s digitizer (not shown) (part of the RBWD 376, or RF Base band Digitizer). The digitized waveforms are digitally downconverted to base band before being stored in the 32 MW digitizer memory (not shown), to be passed to a computer for analysis.

The VSA 374 allows modulation analysis of signals in the 50 MHz to 6 GHz frequency range. In addition, the VSA 374 can operate as a spectrum analyzer from 20 Mhz to 18 GHz.

In embodiments of the present invention, the RBWD 376 contains two separate 14 bit 100 MS/s digitizers. I and Q inputs to the RBWD 376 are available through the BBFE module 360 (see section 6) to digitize base band signals from the DUT.

FIG. 5.3 shows bus connections in relation to an exemplary computing architecture. The VSA/VSG Module 370 uses both the primary Open Architecture Fiber Channel data bus and the optional StarGen StarFabric bridged PCI bus. Data transfer from the RBWG/D (376, 378) memories to the site controller CPU 530 is through the PCI bridge.

In one embodiment of the present invention, the VSA/VSG 370 requires 11 STC Open Architecture 24 mm test head slots.

Tables 5.2 and 5.3 show exemplary specifications for one embodiment of the VSA/VSG module. However, it should be noted that other embodiments may have other specifications and conditions.

TABLE 5.2

Example VSA Specifications

| | | Items | Specification | Conditions |
|---|---|---|---|---|
| VSA | RFDWC | Frequency Ranges | 20 MHz~18 GHz Spectrum Analyzer | Requires Coax Sw on RFMTX, SEL |
| | | | 50 MHz~6 GHz Modulation Analyzer | |
| | | Input Power Level | −120 dBm~20 dBm | Through RFMTX, RFFE, and RFCOM |
| | | Power Meas. Accuracy (init/oinit) | +/−1 dB @ −30 dBm~0 dBm | Through RFMTX, RFFE, and RFCOM |
| | | Noise Floor | −145 dBm/Hz typ | Through RFMTX, RFFE, and RFCOM |
| | RBWD | Number of channels | 2ch | |
| | | Bandwidth (−3 dB) | 40 MHz | |
| | | Anti-aliasing filters | 35 MHz and Digital Filter | |
| | | Input Voltage (max) | −2.5 V to +2.5 V | Through BBFE |
| | | Sampling rate | 100 MS/s | |
| | | Memory | 32 MW/ch | |
| | | Number of bits | 14 bits | |
| | Digital Modulation Analysis | | Spectrum, EVM, Constellation, Eye diagram . . . | |

TABLE 5.3

Example VSG Specifications.

| | | Items | Specification | Conditions |
|---|---|---|---|---|
| VSG | RFUPC | Frequency Range | 50 MHz~6 GHz | |
| | | Freq. Resolution | 0.1 Hz | |
| | | Output Power Level | −120 dBm~0 dBm (50 MHz~2 GHz) | At top of RF HIFIX, through RFFE |
| | | | −120 dBm~−5 dBm (2 GHz~6 GHz) | |
| | | Level Resolution | 0.01 dB | |
| | | Accuracy (after init/oinit) | +/−1 dB @ −30 dBm~0 dBm | At top of RF HIFIX, through RFFE |
| | | Phase Noise | −115 dBc/Hz @ 6 GHz, 100 KHz Offset | |
| | | Output Impedance | 50 ohm | |
| | RBWG | Number of channels | 2ch | |
| | | Frequency Range | DC~50 MHz | |
| | | Output Voltage (max) | −2 V to +2 V | Through BBFE |
| | | Sampling frequency | 200 MS/s | |
| | | Number of bits | 14 bits | |
| | | Anti-aliasing filter | 2.5 MHz/50 MHz/THROUGH | |
| | | Memory | 64 MW/ch | |
| | | Max # of waveforms | 64 | |
| | | Waveform length | 1024 W to 64 MW | |
| | | Distortion | −65 dBc at <5 MHz | Through BBFE |
| | | | −55 dBc at 5 MHz to 20 MHz | |
| | Digital Modulation | Communications standard | GSM, cdma2000, WCDMA and 2G, 802.11a/b/g/h, HiperLAN2, HiSWANa | |
| | | Modulation | GMSK, BPSK, QPSK, 16QAM, 64QAM, OFDM, CCK, etc . . . | |

FIG. 5.4 shows an exemplary block diagram of the RFCOM module 320. The RFCOM Module 320 provides RF functions that are applied in common for all RFFE modules 340 and all DUTs 310. The RFCOM module 320 is comprised of three 6 GHz CW signal generators (CWSG6G) (322, 324, 326), a power amplifier (PA) 327, a two port RF combiner 328, generator low pass filters (Filt) 325, and the receive selector switch (SEL) 323. A trigger interface 321 for the RF instruments to the ASYNC module 410 is also placed on the RFCOM module 320.

CWSG6G #1 322 provides a 50 Mhz to 6 GHz CW signal for two tone testing. When required, the signal from CWSG6G #1 322 is combined with the CW (or modulated) signal from the VSG 372 by the two port combiner 328 to produce the two tone test signal. The power amplifier 327 provides enough gain for the complete RF instrument to produce 0 dBm at the Load Board connectors. At lower output levels the power amplifier 327 is switched out. The Filt block 325 provides switchable 1 GHz, 2 GHz, 3 GHz, and 6 GHz low pass filters to remove harmonics from the generator's output.

CWSG6G #2 324 provides a 50 MHz to 6 GHz local oscillator signal for the Coupler Receivers (not shown) on the RFFE module 340. This signal is mixed with the signals from the directional couplers on the RFFE module 340 to produce base band signals that can be digitized by a base band digitizer (such as the RBWD 376).

CWSG6G #3 326 provides a 50 MHz to 6 GHz CW signal to the DUT local oscillator port through the RFFE 340 and the RFMTX modules 350.

The SEL block 323 is a mechanical coaxial relay that selects which RFFE module 340 will send its signal to the VSA 374. The mechanical relay 323 provides low insertion loss, giving better receiver sensitivity for low-level measurements. Many tests are performed at higher signal levels and can use the Coupler Receivers (see RFFE module 340, FIG. 5.6) with their electronic switching for faster parallel DUT 310 testing.

In one embodiment of the present inventions the RFCOM module 320 requires 9 STC Open Architecture 24 mm test head slots.

TABLE 5.4

Example CWSG6G specifications.

| | Items | Specification | Conditions |
|---|---|---|---|
| CWSG6G | Frequency Range | 50 MHz~6 GHz | |
| | Freq. Resolution | 1 Hz | |
| | Output Power level | −70 dBm~0 dBm | At top of HIFIX, through RFFE, RFMTX |
| | Level Resolution | 0.1 dB | |
| | Accuracy (after init/oinit) | +/−0.8 dB @ −30 dBm~0 dBm | At top of HIFIX, through RFFE, RFMTX |

TABLE 5.4-continued

Example CWSG6G specifications.

| Items | Specification | Conditions |
|---|---|---|
| Phase Noise | −115 dBc/Hz @ 6 GHz, 100 KHz Offset | |
| Output Impedance | 50 ohm | |

TABLE 5.5

Example Filt specifications.

| | Items | Specification |
|---|---|---|
| Filt | Cutoff frequencies | 1 GHz, 2 GHz, 3 GHz, 6 GHz |

FIG. 5.5 shows an exemplary block diagram of the RFDIST module. The RFDIST Module 330 enables parallel DUT 310 testing by distributing the RF, DUT local oscillator, and system local oscillator signals to four RFFE modules 340. If only a single RFFE module 340 is used, the RFDIST module 330 is not required. The three power dividers 332 divide the RF, DUT local oscillator, and system local oscillator signals each to 4 ports. Each of the power dividers 332 has an amplifier (not shown) on each output port to compensate for the divider signal loss and to provide isolation between the ports. Thus, the conditions at one DUT 310 do not affect the signals at the other DUTs 310 during parallel testing.

FIG. 5.6 shows an exemplary block diagram of the RFFE module 340. The RFFE 340, or RF Front End, module provides directional couplers 347 on each DUT RF line to measure forward and reflected power, and to enable the CMR (Coupler-Mixer Receiver). Additional circuitry aids in calibration and diagnostics. An optional noise source 345 may be connected on the RFFE module 340 for noise figure tests.

The signal from the VSG 372, the signal to the VSA 374, and the DUT LO signal each pass through directional couplers on the RFFE module 340. The coupled signals are each mixed with the system local oscillator signal distributed by the local SG divider 346 (from the CWSG6G 324 on the RFCOM module 320) and downconverted to base band where they can be digitized by the RBWD 376 or other system digitizer. The directional coupler 341 and mixer form the heart of the CMR, or Coupler-Mixer Receiver.

The optional noise source 345 can be switched to the DUT Rx port for noise figure testing. The power detector 348 and a loopback path near the output of the module 340 aid in calibration and diagnostics.

TABLE 5.6

Example RFFE Specifications.

| | | Items | Specification | Conditions |
|---|---|---|---|---|
| CMR Coupler-Mixer | Coupler Mixer | Frequency Range | 500 MHz~6 GHz | At top of RF Hifix through RFMTX |
| | | Input Power Level | −70 dBm~10 dBm | |
| Receiver (with RBWD) | System Local CWSG6G RBWD | Frequency Range | 50 MHz~6 GHz | |
| | | Frequency Resolution | 1 Hz | |
| | | Number of channels | 2ch | |
| | | Bandwidth | 35 MHz | |
| | | Sampling Frequency | 100 MS/s | |

TABLE 5.6-continued

Example RFFE Specifications.

| Items | Specification | Conditions |
|---|---|---|
| Memory | 32 MW/ch | |
| Number of bits | 14 bits | |

FIG. 5.7 shows an exemplary block diagram of the RFMTX. The RFMTX module 350 provides multiple Load Board connections for the inputs and outputs of the RFFE 340. This can greatly reduce Load Board component count and simplify layout.

Each RFMTX module 350 can handle two RFFE modules 340. The switches 352 on the RFMTX module 350 connect the RFFE DUT Rx port to one of four DUT 310 input ports. Four DUT 310 output ports are switched to the DUT Tx port of the RFFE 340, while the DUT LO signal is switched between two DUT 310 connections. Inactive connections are terminated in 50 ohms.

There are two optional switch types for the RFMTX module 350, coaxial mechanical relays or semiconductor switches. Semiconductor switches provide faster switching speeds, but are limited to 6 GHz bandwidth and have more insertion loss. The coaxial mechanical relays provide 18 GHz bandwidth with less insertion loss, but at slower switching speeds.

TABLE 5.7

Example RFMTX specifications

| | Items | Specification | Conditions |
|---|---|---|---|
| RFMTX | | RF ports | 2 DUTs; 4: Tx, 4: Rx, 2: LO/DUT |
| | Semiconductor Switch Option | Bandwidth | 20 MHz~6 GHz |
| | | Switching Time | 2 ms to 0.1 dB |
| | | Power handling | 24 dBm +/−25 V DC |
| | | Lifetime | infinite |
| | | Impedance | 50 ohms |

TABLE 5.7-continued

Example RFMTX specifications

| Items | | Specification | Conditions |
|---|---|---|---|
| Coaxial Mechanical Relay Option | Bandwidth | DC~18 GHz | |
| | Switching Time | 20 ms | |
| | Power handling | 5 W (34 dBm), 0 V DC | Relay only |
| | Contact Life | 5 million cycles | |
| | Impedance | 50 ohms | |

The RFPA module increases the VSG output power level specification. This is particularly useful for power amplifier testing.

RF Calibration is performed on the RF modules as a complete instrument. The calibration plane is the top of the RF HIFIX, at the blind mate RF connectors. Normal calibration is performed at system determined fixed frequencies. The calibration values at intermediate frequency points are interpolated from the values at the nearest calibration frequencies. Focused calibration is available to provide greater accuracy at user-defined frequencies.

Calibration values are stored in a file on the site controller disk and are loaded into the RF hardware during init.

Calibration is performed using a Calibration Load Board and an external power meter, which provides NIST traceability.

Table 5.8 shows exemplary specifications for the RF Modules connected together as a complete RF instrument. These specifications apply at the RF HIFIX, at the blind mate coaxial connectors that connect to the Load Board, after calibration.

TABLE 5.8

Example Complete RF Instrument Specifications

| | Item | T2000 RF |
|---|---|---|
| RF MTX | RF Port | 4: Tx, 4: Rx, 2: Lo |
| | Switch Option | Semiconductor Switch or Coaxial Mechanical Switch |
| | Switching Time | 2 mS @ −0.1 dB Settled(Semi) 20 mS(Coaxial) |
| CWSG6G | Frequency Range | 50 MHz~6 GHz |
| | Freq. Setting Resolution | 1 Hz |
| | Output Power Level | −70 dBm~0 dBm |
| | Level Setting Resolution | 0.01 db |
| | Accuracy(after init/oinit) | +−0.8 dB @ −30 dBm~0 dBm |
| | Phase Noise | −115 dBc/Hz @ 6 GHz, 100 KHz Offset |
| | Output Impedance | 50 ohm |

TABLE 5.8-continued

Example Complete RF Instrument Specifications

| | | Item | T2000 RF |
|---|---|---|---|
| VSG/VSA VSG | RF UPC | Frequency ranges | 50 MHz~6 GHz |
| | | Freq. Setting Resolution | 0.1 Hz |
| | | Output Power level | −120 dBm~0 dBm(50 M~2 GHz) |
| | | | −120 dBm~5 dBm(2 GHz~6 GHz) |
| | | Level Setting Resolution | 0.01 dB |
| | | Accuracy(after init/oinit) | +−0.8 dB @ −30 dBm~0 dBm |
| | | Phase Noise | −115 dBc/Hz @ 6 GHz, 100 KHz Offset |
| | | Output Impedance | 50 ohm |
| | RBWG | Number of Channels | 2 ch |
| | | Frequency ranges | DC~50 MHz |
| | | Output Voltage | >3 Vpp(T.B.D.) |
| | | Anti-Aliasing Filter | THROUGH/2.5 MHz/50 MHz |
| | | Sampling frequency | 200 Msps |
| | | Memory | 64 MW/ch |
| | | Number of bits | 14 bits |
| VSG/VSA VSA | RF DWC | Frequency ranges | 20 MHz~18 GHz(Coaxial SW) |
| | | | 50 MHz~6 GHz(Semi SW) |
| | | Input Power level | −120 dBm~20 dBm |
| | | Power Meas. Accuracy (after init/oinit) | +−1 db @ −30 dBm~0 dBm |
| | | Noise Floor | −145 dBm/Hz typ |
| | RBWD | Number of channels | 2 ch |
| | | Band width | 35 MHz |
| | | Input Voltage | >2 Vpp(T.B.D.) |
| | | Sampling frequency | 100 Msps |
| | | Memory | 32 MW/ch |
| | | Number of bits | 14 bits |
| Vecter Receiver in RF Front End with RBWD | Coupler Mixer System Local CWSG | Frequency ranges | 500 MHz~6 GHz |
| | | Input Power level | −70 dBm~10 dBm |
| | | Frequency Range | 50 MHz~6 GHz |
| | | Freq. Setting Resolution | 1 Hz |
| | RBWD | Number of channels | 2 ch |
| | | Band width | 35 MHz |
| | | Input Voltage | >2 Vpp(T.B.D.) |
| | | Sampling frequency | 100 Msps |
| | | Memory | 32 MW/ch |
| | | Number of bits | 14 bits |
| Test Capability | Digital Modulation | Communication standard | GSM, cdma2000, WCDMA and 2 G 802.11b/a/g/h, HiperLAN2, HiSWANa |
| | | Modulation | GMSK, BPSK, QPSK, 16QAM, 64QAM, OFDM, CCK. . . etc |
| | Digital Modulation Analysis | | Spectrum, EVM, Constelletion chart Eye diagram . . . |

When multiple devices are tested in parallel, the device setup and RF instrument setup for each test are done simultaneously for all the DUTs. RF signals are applied to all DUTs simultaneously. However, to reduce system size and cost, signals received from the DUTs are digitized from each DUT sequentially. By utilizing the CMR Receiver (Coupler-Mixer Receiver) for most tests, one can take advantage of fast electronic switching to sequentially connect each DUT to the digitizer. At 100 MS/s sampling rate, digitizing 4K points takes about 40 microseconds. The penalty for digitizing sequentially at this rate for four DUTs is 3×40 us=120 us, plus the overhead for switching. See the illustration in FIG. 5.8.

FIG. 6.1 shows an exemplary block diagram of the BBFE 360. The BBFE 360 allows two channels of digitizer and two channels of AWG to test up to four DUTs 310 in parallel (with 2 channels of AWG and 2 channels of digitizer per DUT 310).

The BBFE is intended for use with the RBWG/D (377, 376) in the VSA/VSG module 370, or the BBWG/D module 610 (as shown in FIG. 7.1).

The signals from a pair of AWGs are buffered and distributed to four sets of differential output drivers (not shown), while the signals from four DUTs 310 are likewise buffered and sent to a pair of electronic switches (not shown) that select one set of signals to send on to a pair of digitizers. By rapidly sequencing the signals from the four DUTs 310, the digitizers can sequentially digitize the signals from all four DUTs 310. Usually at frequencies above audio, the actual digitization time is small compared to the time spent setting up the DUTs 310 and tester for a test, and performing other non-digitizing tests. Thus, only a small test time penalty is paid for savings in cost and test head space.

Each of the four pairs of input and output buffers has its own DC offset control. Additionally, the four pairs of inputs and outputs are differential.

TABLE 6.1

Example BBFE Specifications

| | | Items | Specification | Conditions |
|---|---|---|---|---|
| BBFE | AWG output section | Output type | Differential | |
| | | Number of differential channels | 2 ch × 4 parallel ports | |
| | | Impedance | 50 ohm SE; 100 ohm diff., +/−2% | |
| | | Coupling | AC (0.01 uF), DC | |
| | | Bandwidth (−3 dB) | 100 MHz | |
| | | Amplitude ranges | 500 mVpp to 2 Vpp | |
| | | Maximum output voltage | −2 V to +2 V | |
| | | Maximum output current | 20 mA | |
| | | Common mode DC offset | Per channel | |
| | | Offset range | +/−2 V | |
| | | Offset resolution | 0.5 mV | |
| | | Offset settling time | 1 ms | |
| | DGT input section | Input type | Differential | |
| | | Number of differential channels | 2 ch × 4 selected port | |
| | | Impedance | Selectable 1M or 50 ohm SE; 2M or 100 ohm diff. | |
| | | Coupling | AC (0.01 uF), DC | |
| | | Bandwidth (−3 dB) | 100 MHz (50 ohm input) 30 MHz (1 Mohm input) | |
| | | Amplitude ranges | +/−500 mV to +/−1.4 V | |
| | | Maximum input voltage | −2.5 V to +2.5 V | |
| | | Prog. DC offset | Per channel | |

FIG. 7.1 shows an exemplary block diagram of the BBWG/D. The BBWG/D 620, or Base band Waveform Generator/Digitizer Module, is an arbitrary waveform generator and digitizer module intended for testing the wide bandwidth base band signals used by Wireless LAN devices, as well as for video band AC tests, Digital TV device testing, etc.

In addition to a pair of AWGs 625 and digitizers 620, the module 610 also provides two reference voltage sources and PMU 630 capability.

The AWGs 625 have 16 bit resolution at up to 200 MS/s, while the digitizers 620 have 12 bit resolution at up to 200 MS/s.

TABLE 7.1

Example BBWG Specifications

| | | Items | Specification |
|---|---|---|---|
| BBWG/D | BBWG | Sampling Rate (max) | 200 MS/s |
| | | Resolution | 16 bits |
| | | Memory | 1 MW/ch |
| | | Number of differential channels | 2 ch × 3 switch selected ports |
| | | Output type | Differential |
| | | Impedance | 50 ohm SE; 100 ohm diff |
| | | Bandwidth (−3 dB) | 70 MHz |
| | | Voltage range | +/−125 mV to +/−2 V |
| | | Anti-aliasing filter | 20 MHz, 50 MHz |
| | | DC linearity | +/−0.1% of FS |
| | | Distortion | −70 dBc at 100 KHz to 5 MHz −65 dBc at 5 MHz to 10 MHz −50 dBc at 10 MHz to 20 MHz −30 dBc at 20 MHz to 50 MHz |

TABLE 7.2

Example BBWD Specifications

| | | Items | Specification |
|---|---|---|---|
| BBWG/D | BBWD | Sampling Rate (max) | 200 MS/s |
| | | Resolution | 12 bits |
| | | Memory | 512 KW × 2 banks/ch |
| | | Number of differential channels | 2 ch × 4 switch selected ports |
| | | Output type | Differential |
| | | Impedance | Selectable 1M or 50 ohm SE; 2M or 100 ohm diff. |
| | | Bandwidth (−3 dB) | 70 MHz (50 ohm input) 30 MHz (1M ohm input) |
| | | Voltage range | +/−350 mV to +/−2.5 V |
| | | Anti-aliasing filter | 20 MHz, 70 MHz and Digital Filter |
| | | DC linearity | +/−0.1% of FS |
| | | Distortion | −70 dBc at 100 KHz to 5 MHz −65 dBc at 5 MHz to 10 MHz −50 dBc at 10 MHZ to 20 MHz |

FIG. 8.1 shows an exemplary block diagram of the AVWG/D 710. The AVWG/D 710, or Audio Video Waveform Generator/Digitizer Module, is an arbitrary waveform generator and digitizer module intended for low cost testing of audio and video devices. It also has high DC linearity, needed for certain types of DAC and ADC testing.

In addition to a pair of AWGs 720 and digitizers 725, the module also provides two reference voltage sources and PMU 730 capability.

Each AWG 720 has two sources, a low speed 16 bit resolution DAC that clocks at up to 1 MS/s, and a high speed 16 bit resolution DAC that clocks at up to 50 MS/s. The digitizers 725 each have two ADCs, a 16 bit resolution ADC that can be clocked at up to 750 KS/s, and a 14 bit ADC that can be clocked at up to 50 MS/s.

TABLE 8.2

Example AVWD Specifications

| | | Items | Specification |
|---|---|---|---|
| AVWG/D | AVWG | Resolution/Sampling Rate | 16 bit/1 MS/s |
| | | | 16 bit/50 MS/s |
| | | Memory | 1 MW/ch |
| | | Number of differential channels | 2 ch × 3 switch selected ports |
| | | Output type | Differential |
| | | Impedance | 50 ohm(+/−2%) or Low-Z SE; |
| | | | 100 ohm(+/−2%)or Low-Z diff; |
| | | Coupling | AC (0.01 uF), DC |
| | | Bandwidth (−3 dB) | 200 KHz/20 MHz |
| | | Voltage range | +/−16 mV to +/−5 V |
| | | Anti-aliasing filter | 1 KHz, 1 MHz/15 MHz |
| | | DC linearity | +/−0.006% of FS |
| | | Distortion | −100 dBc at 1 KHz focused |
| | | | −80 dBc at 10 Hz to 100 KHz |
| | | | −68 dBc at 100 KHz to 1 MHz |
| | | | −60 dBc at 1 MHz to 5 MHz |
| | | | −50 dBc at 5 MHz to 10 MHz |
| AVWG/D | AVWD | Resolution/Sampling Rate | 16 bit/750 KS/s |
| | | | 14 bit/50 MS/s |
| | | Memory | 512 KW × 2 banks/ch |
| | | Number of differential channels | 2 ch × 4 switch selected ports |
| | | Output type | Differential |
| | | Impedance | Selectable 1M or 50 ohm SE; |
| | | | 2M or 100 ohm diff. +/−2% |
| | | Bandwidth (−3 dB) | 300 KHz/30 MHz |
| | | Voltage range | +/−125 mV to +/−5 V |
| | | Anti-aliasing filter | 100 KHz/20 MHz, and Digital Filter |
| | | DC linearity | +/−0.006% of FS |
| | | Distortion | −100 dBc at 1 KHz focused |
| | | | −86 dBc at 10 Hz to 10 KHz |
| | | | −78 dBc at 10 KHz to 100 KHz |
| | | | −65 dBc at 100 KHz to 1 MHz |
| | | | −53 dBc at 1 MHz to 5 MHz |
| | | | −50 dBc at 5 MHz to 10 MHz |

FIG. 9.1 shows an exemplary block diagram of the 250M DM 840, highlighting the DCAP 842 and DAW memories 844. The 250 MHz digital module 840 can capture data from an A/D converter or other device that generates digital data representing an analog waveform, and store that data for processing by mixed-signal analysis tools (such as the FFT). To capture data in this fashion, the digital module 840 is used in the DCAP mode, or Digital CAPture mode. Each digital pin (or channel) can operate in DCAP mode, but there are some restrictions and memory limitations as noted in the tables below. Memory for digital pins that run from the same PG can be combined to provide larger memories for fewer numbers of pins.

The 250 MHz digital module 840 can also be used to generate digital data representing an analog waveform, such as might be used as the inputs to a D/A converter under test. This mode is called DAW, for Digital Arbitrary Waveform. In this mode, the SCAN memory is used to store DAW data on a per channel basis. As in the DCAP mode above, memory size can be traded off versus the number of active pins on a single PG, as noted in the tables below.

TABLE 9.1

Example DCAP Specifications

| | Items | Specification | Conditions |
|---|---|---|---|
| DCAP | DCAP data source | Compare LOW result | |
| | Memory size | 2 Mbit/DM ch | Channel link mode = normal |
| | | | 8 DCAP ch/PG max |
| | | | Max ch per domain = 1024 |
| | | 4 Mbit/DM ch | Channel link mode = x2 |
| | | | 4 DCAP ch/PG max |
| | | | Max ch per domain = 512 |
| | | 8 Mbit/DM ch | Channel link mode = x4 |
| | | | 2 DCAP ch/PG max |
| | | | Max ch per domain = 256 |
| | | 16 Mbit/DM ch | Channel link mode = x8 |
| | | | 1 DCAP ch/PG max |
| | | | Max ch per domain = 128 |
| | Operating Frequency (Max} | 250 MHz | Normal Rate mode |
| | | 500 MHz | Double Rate mode |

TABLE 9.1-continued

Example DCAP Specifications

| Items | Specification | Conditions |
|---|---|---|
| Trigger mode | Pattern synchronous or DUT output synch | |
| Trigger Continuous capture offset | 0 to 63 cycles | |
| Continuous capture | 0 to 1023 cycles | |

TABLE 9.2

Example Maximum DCAP capture data
Maximum DCAP Capture Data

| | 1 bit > 8 bit | 1 bit > 16 bit | 1 bit > 32 bit |
|---|---|---|---|
| Normal mode | 256K × 8 | 128K × 16 | 64K × 32 |
| x2 mode | 512K × 8 | 256K × 16 | 128K × 32 |
| x4 mode | 1M × 8 | 512K × 16 | 256K × 32 |
| x8 mode | 2M × 8 | 1M × 16 | 512K × 32 |

TABLE 9.3

Example DAW Specifications

| | Items | Specification | Conditions |
|---|---|---|---|
| DAW | DAW data source | SCAN memory | |
| | Memory size | 128 Mbit/DM ch | Channel link mode = normal 8 DAW ch/PG max Max ch per domain = 1024 |
| | | 256 Mbit/DM ch | Channel link mode = x2 4 DAW ch/PG max Max ch per domain = 512 |
| | | 512 Mbit/DM ch | Channel link mode = x4 2 DAW ch/PG max Max ch per domain = 256 |
| | | 1 Gbit/DM ch | Channel link mode = x8 1 DAW ch/PG max Max ch per domain = 128 |
| | Data Cache | 250 MHz | Normal Rate mode |
| | Operating Frequency (Max) | 500 MHz | Double Rate mode |
| | VGC frequency (max) | 50 MHz | |
| | Vector Address frequency (max) | 250 MHz | |

Software provides GUI tools for generating and analyzing waveforms, and for setting and displaying the condition of the hardware. Software support is provided for shared resource parallel DUT testing, as well as RF test classes for OASIS. Calibration and diagnostic software are also provided.

Figure 10:
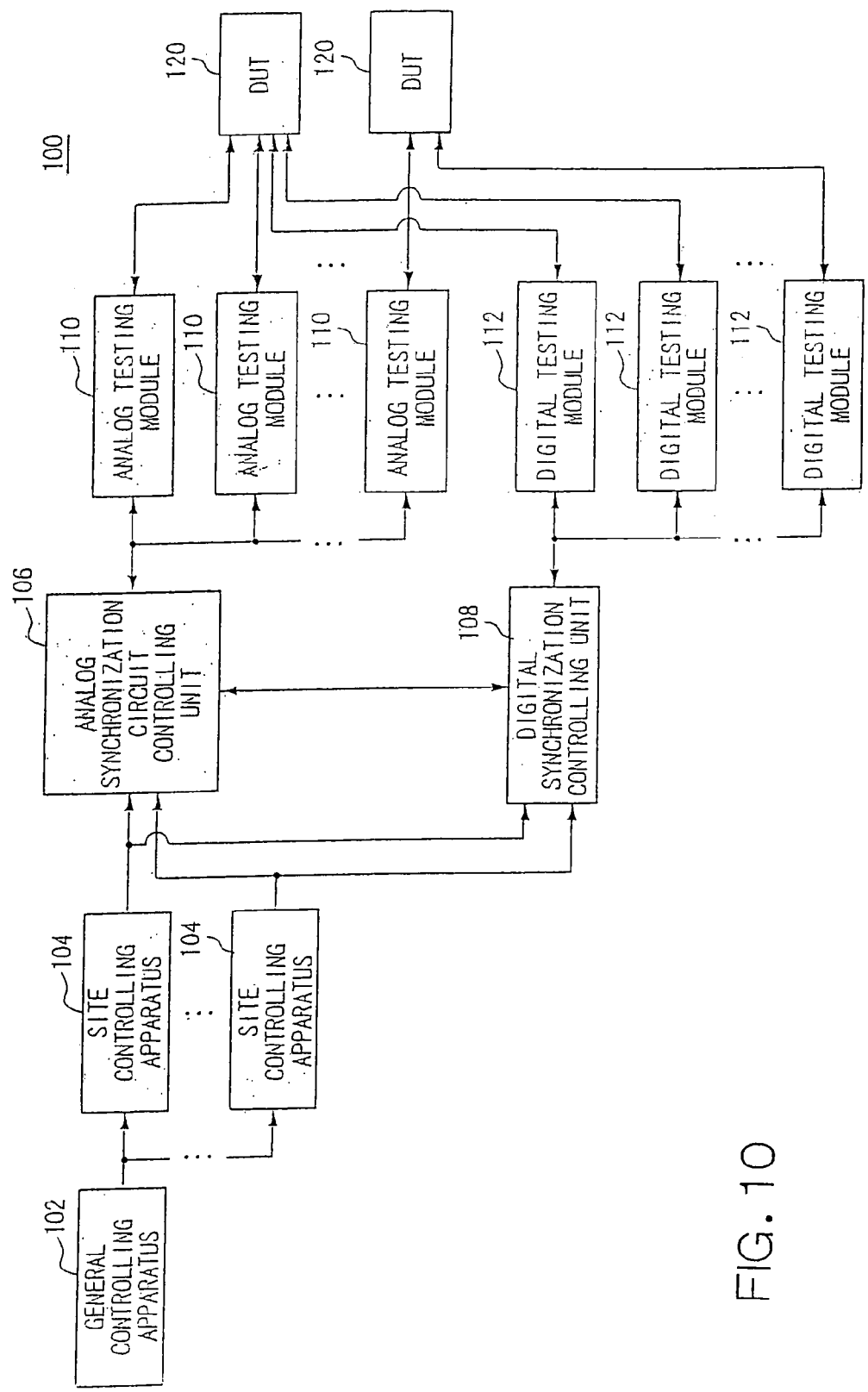
FIG. 10 shows an example of the configuration of a testing apparatus 100 related to an exemplary embodiment of the present invention.

FIG. 10 shows an example of the configuration of a testing apparatus 100 related to an exemplary embodiment of the present invention. The testing apparatus 100 includes a general controlling apparatus 102, site controlling apparatuses 104, analog synchronization circuit controlling units 106, digital synchronization controlling units 108, a plurality of analog testing modules 110 and a plurality of digital testing modules 112. The plurality of analog and digital testing modules 110 and 112 are an example of the testing modules of the present invention.

The testing apparatus 100 generates and supplies test signals to the devices under test 120, obtains the output signals outputted by the devices under test 120 as a result of their operations in response to the test signals, and judges the quality of the devices under test 120 based on the output signals. The testing apparatus 100 uses modules based on an open architecture as the analog or digital testing module 110 or 112 for supplying the test signal to the device under test 120. In other words, to a plurality of testing module slots, different types of analog or digital testing modules 110 or 112 for generating different types of test signals for the test of the devices under test 120 respectively are optionally mounted.

The general controlling apparatus 102 obtains and stores a test controlling program, a testing program, test data, etc. used for the test of the devices under test 120 via an external network. The site controlling apparatus 104 controls the analog and digital testing modules 110 and 112, and tests the plurality of devices under test 120 in parallel at the same time. The connection relation between the site controlling apparatus 104 and the analog and digital testing modules 110 and 112 is changed corresponding to the number of pins of the device under test 120, the wiring type of the performance board, the type of the analog and digital testing modules 110 and 112, etc. In other words, each of the plurality of site controlling apparatuses 104 performs a different test sequence in response to the performance of the devices under test 120 by dividing the plurality of analog and digital testing modules 110 and 112 into plural sites, and controlling the operation of the analog or digital testing module 110 or 112 included in each site.

The site controlling apparatus 104 obtains and executes the test controlling program from the general controlling apparatus 102. And, the site controlling apparatus 104 obtains the testing program and the test data used in the test of the device under test 120 based on the test controlling program, and supply them to the analog or digital testing module 110 or 112 used in the test of each of the devices under test 120. Then, the site controlling apparatus 104 instructs the analog or digital testing module 110 or 112 to start the test based on the testing program and the test data by supplying the trigger signal and the clock signal from the analog synchronization circuit controlling unit 106 to the analog or digital testing module 110 or 112. And, the site controlling apparatus 104 receives an interruption indicating the end of the test from the analog or digital synchronization controlling unit 106 or 108, and informs the general controlling apparatus 102 of it.

The analog synchronization circuit controlling unit 106 controls the test sequences by the analog testing modules 110 based on the control of the site controlling apparatus 104. For example, the analog synchronization circuit controlling unit 106 supplies the analog testing module 110 with the trigger signal to start the test operation of the device under test 120 and the clock signal to control the test operation, and receives the trigger return signal indicating the completion of the test operation of the analog testing module 110 from the analog testing module 110. In addition, the analog and digital synchronization controlling units 106 and 108 may hand over the trigger return signal to each other. For example, the digital synchronization controlling unit 108 may hand over the trigger return signal received from the digital testing module 112 to the analog synchronization circuit controlling unit 106, and the analog synchronization circuit controlling unit 106 may supply the trigger signal to the analog testing module 110 based on the trigger return signal received from the digital synchronization controlling unit 108.

Particularly, the analog synchronization circuit controlling unit 106 has a function as operation order holding means of the present invention, so that it can hold the information indicating that the test operation by a first testing module 110 among the plurality of analog testing modules 110 should be performed before the test operation by a first testing module 110 among the plurality of analog testing modules 110. For example, the analog synchronization circuit controlling unit 106 is set in advance by hardware before the test of the device under test 120 begins in order to supply the trigger signal to the second analog testing module 110 when receiving the trigger return signal from the first analog testing module 110. And, the analog synchronization circuit controlling unit 106 has a function as trigger return signal receiving means of the present invention and thus receives the trigger return signal indicating that the first analog testing module 110 completes its test operation, when the test operation of the first analog testing module 110 has been finished, from the first analog testing module 110. And, the analog synchronization circuit controlling unit 106 has a function as trigger supplying means of the present invention and thus supplies the second analog testing module 110 with the trigger signal indicating that the second analog testing module 110 should begin its test operation, when the trigger return signal receiving means receives the trigger return signal.

In addition, if the analog testing module 110 performs different types of testing operations in parallel for one or more devices under test 120, the analog synchronization circuit controlling unit 106 may operate in the following manner. The analog synchronization circuit controlling unit 106 has a function as the operation order holding means of the present invention and thus holds the information indicating that the first test operation by a first analog testing module 110 should be performed before the test operation by a second analog testing module 110, and the information indicating that the second test operation by the first analog testing module 110 should be performed before the test operation by the third analog testing module 110. And, the analog synchronization circuit controlling unit 106 has a function as the trigger return signal receiving means of the present invention and thus receives a first trigger return signal indicating that the first analog testing module 110 completes the first test operation, when the first test operation of the first analog testing module 110 has been finished, from the first analog testing module 110, and a second trigger return signal * indicating that the first analog testing module 110 completes the second test operation, when the second test operation of the first analog testing module 110 has been finished, from the first analog testing module 110. And, the analog synchronization circuit controlling unit 106 has a function as the trigger signal supplying means of the present invention and thus supplies the second analog testing module 110 with a first trigger signal indicating that the second analog testing module 110 should begin its test operation, when the trigger return signal receiving means receives a first trigger return signal, and supplies the third analog testing module 110 with a second trigger signal indicating that the third analog testing module 110 should begin its test operation, when the trigger return signal receiving means receives a second trigger return signal.

As above, according to the testing apparatus 100 related to this embodiment, by supplying the trigger signal to a predetermined analog testing module 110 based on the trigger return signal received from a predetermined analog or digital testing module 110 or 112 during test operation, where the analog synchronization circuit controlling unit 106 is set in advance by hardware, the predetermined analog testing module 110 can start its operation, and a plurality of analog and digital testing modules 110 and 112 can operate in a desired order. Accordingly, although the analog and digital testing modules 110 and 112 mounted to the plurality of testing module slots are optionally changed, it is possible to reduce the work required to make the test program corresponding to the mounting positions or the combination of the testing modules, and to curtail the time required to test the devices under test. Further, the digital synchronization controlling unit 108 may control the test operation of the digital testing module 112 by functioning as the analog synchronization circuit controlling unit 106 described above.

Figure 11:
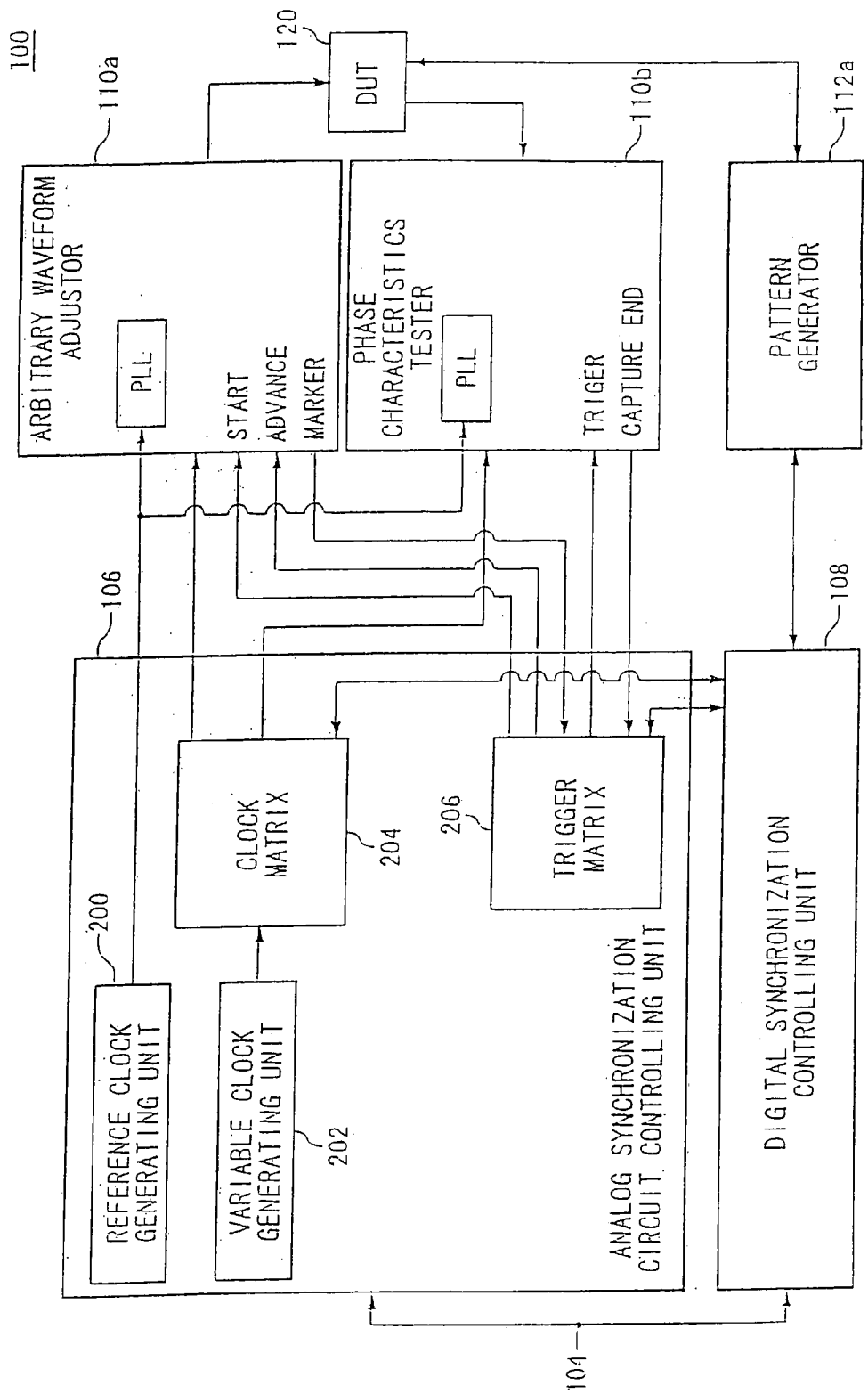
FIG. 11 shows an example of the detailed configuration of a testing apparatus 100 related to this embodiment.

FIG. 11 shows an example of the detailed configuration of the testing apparatus 100 related to this embodiment. The testing apparatus 100 includes an arbitrary waveform adjustor 110*a*, and a phase characteristics tester 110*b* as the analog testing module 110, and a pattern generator 112*a* as the digital testing module 112. The analog synchronization circuit controlling unit 106 includes reference clock generating unit 200, a variable clock generating unit 202, a clock matrix 204, and a trigger matrix 206.

The arbitrary waveform adjustor 110*a* generates and supplies an arbitrary analog waveform to the device under test 120 based on the control of the analog synchronization circuit controlling unit 106. In addition, the phase characteristics tester 110*b* receives the analog waveform outputted by the device under test 120 in response to the analog waveform supplied from the arbitrary waveform adjustor 110*a*, and tests the phase characteristics of the analog waveform. The arbitrary waveform adjustor 110*a* and the phase characteristics tester 110*b* have PLL (Phase Locked Loop) circuits, and operate while generating internal clocks based on the reference clock generated by the reference clock generating unit 200. The pattern generating unit 112*a* sets the device under test 120 by generating and supplying a digital pattern to the device under test 120 based on the control of the digital synchronization controlling unit 108.

The clock matrix 204 is set with respect to hardware in advance before the test of the device under test 120, so that the connections of the input and the output are determined. In other words, which clock signal from the variable clock generating unit 202, the digital synchronization controlling unit 108, the performance board, etc. is supplied to the arbitrary waveform adjustor 110*a* or the phase characteristics tester 110*b* is determined. In addition, the trigger-matrix 206 is set with respect to hardware in advance before the test of the device under test 120, so that the connections of the input and the output are determined. In other words, when a trigger return signal from any of the arbitrary waveform adjustor 110*a*, the phase characteristics tester 110*b*, the pattern generator 112*a*, etc. is received, which the arbitrary waveform adjustor 110a or the phase characteristics tester 110b the trigger signal is supplied to is determined.

That is, the trigger matrix 206 has a function as the operation order holding means of the present invention, and thus holds the information indicating that the supply operation of the arbitrary waveform adjustor 110a to the device under test 120 should be performed before the receiving operation of the phase characteristics tester 110b from the device under test 120. And, the trigger matrix 206 has a function as the trigger return signal receiving means, and thus receives a trigger return signal indicating that the arbitrary waveform adjustor 110a completes its supply operation, when the arbitrary waveform adjustor 110a has finished the supply operation of the analog waveform at a predetermined time, from the arbitrary waveform adjustor 110a. And, the trigger matrix 206 has a function as the trigger signal supplying means, and thus supplies a trigger signal indicating that the phase characteristics tester 110b should begin its operation to receive the analog waveform from the device under test 120, when the trigger return signal receiving means has received the trigger return signal, to the phase characteristics tester 110b.

As above, by sequentially controlling the operations of the arbitrary waveform adjustor 110a and the phase characteristics tester 110b through receiving and sending the trigger return signal and the trigger signal, although there occurs a delay in applying the analog waveform to the device under test 120 by the arbitrary waveform adjuster 110a, the phase characteristics tester 110b does not start to receive the analog waveform as long as there occurs no trigger return signal from the arbitrary waveform adjustor 110a, whereby there isn't any disorder in the test sequences to allow the phase characteristics tester 110b to start to receive the analog waveform before the arbitrary waveform adjustor 110a finishes applying the analog waveform, while the arbitrary waveform adjustor 110a and the phase characteristics tester 110b can be operated in a proper order and with proper timing.

Figure 12:
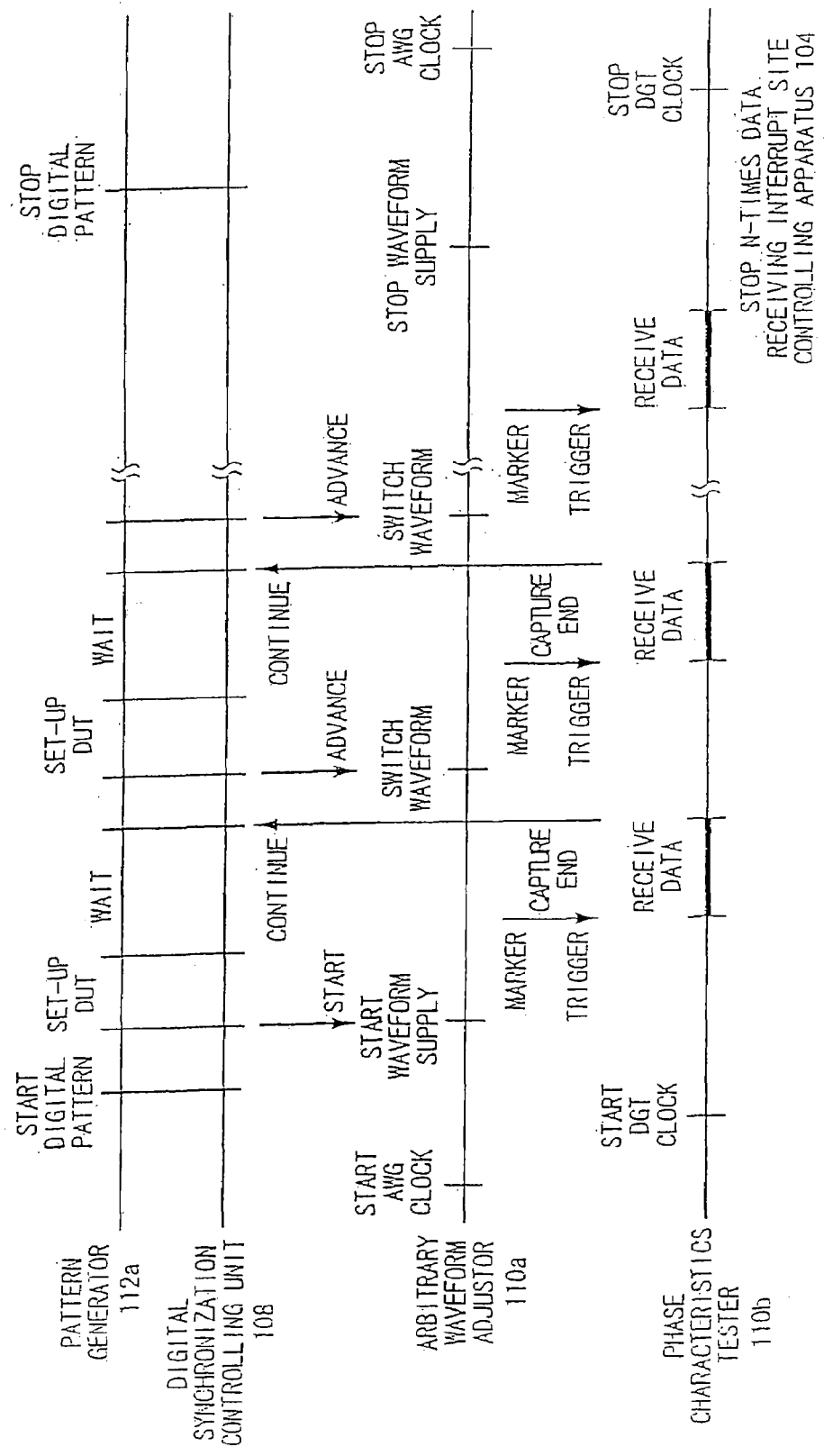
FIG. 12 shows an example of the operation sequence of a testing apparatus 100 related to this embodiment.

FIG. 12 shows an example of the operation sequence of the testing apparatus 100 related to this embodiment. First, the reference clock generating unit 200 makes the arbitrary waveform adjustor 110a and the phase characteristics tester 110b capable of operating by applying the reference clock to the arbitrary waveform adjustor 100a and the phase characteristics tester 110b. At this time, the arbitrary waveform adjustor 110a is in a wait state for a start signal as an example of the trigger signal, and the phase characteristics tester 110b is in a wait state for the trigger signal.

Then, the pattern generator 112a generates and supplies a digital pattern to the device under test 120 based on the control of the digital synchronization controlling unit 108, and sets up the device under test 120. The pattern generator 112a turns into the wait state when the set-up of device under test 120 is completed. Meanwhile, when the start signal is supplied to the arbitrary waveform adjustor 110a from the digital synchronization controlling unit 108 via the trigger matrix 206, the arbitrary waveform adjustor 110a generates the analog waveform stored in a pattern memory, and starts to supply the device under test 120. And, the arbitrary waveform adjustor 110a supplies a marker signal as an example of the trigger return signal to the trigger matrix 206, when finishing its supply operation at a predetermined time of the analog waveform to the device under test 120. The trigger matrix 206 supplies the trigger signal to the phase characteristics tester 110b, when receiving the marker signal from the arbitrary waveform adjustor 110a.

And, the phase characteristics tester 110b receives the analog waveform outputted from the device under test 120 in response to the analog waveform supplied from the arbitrary waveform adjustor 110a, when receiving the trigger signal from the trigger matrix 206. The phase characteristics tester 110b supplies a capture end signal as an example of the trigger signal to the trigger matrix 206, when finishing the receiving operation of the analog waveform outputted from the device under test 120. And, the trigger matrix 206 supplies a continue signal to the digital synchronization controlling unit 108, when receiving the capture end signal from the phase characteristics tester 110b. The digital synchronization controlling unit 108 allows the pattern generator 112a to generate a new digital signal and set up the device under test 120, when receiving the continue signal. The pattern generator 112a turns into the wait state, when the set-up of the device under test 120 is finished. In addition, the digital synchronization controlling unit 108 supplies an advance signal as an example of the trigger signal, when receiving the capture end signal from the trigger matrix 206. The trigger matrix 206 supplies the advance signal as an example of the trigger signal to the arbitrary waveform adjustor 110a, when receiving the advance signal from the digital synchronization controlling unit 108.

And, the arbitrary waveform adjustor 110a switches the analog waveform by generating the next analog waveform stored in the pattern memory and starts to supply the device under test 120, when receiving the advance signal from the trigger matrix 206. As above, by sequentially repeating the set-up operation of the pattern generator 112a, the supply operation of the arbitrary waveform adjustor 110a, and the receiving operation of the phase characteristics tester 110b, the output waveform of the device under test 120 is received by the phase characteristics tester 110b in response to each of the plurality of different analog waveforms. And, the phase characteristics tester 110b generates an interruption to the site controlling apparatus 104 and informs that the test sequence is finished, when a predetermined number of output waveforms have been received. And, the site controlling apparatus 104 stops the arbitrary waveform adjustor 110a supplying the analog waveform to the device under test 120, stops the digital synchronization controlling unit 108 operating, and stops the pattern generator 112a supplying the digital pattern to the device under test 120. And, the site controlling apparatus 104 stops the reference clock generating unit 200 supplying the reference clock to the arbitrary waveform adjustor 110a and the phase characteristics tester 110b.

As above, the trigger matrix 206 performs receiving and sending with regard to the start signal, the marker signal, the trigger signal, the capture end signal, the continue signal, or the advance signal from and to the arbitrary waveform adjustor 110a, the phase characteristics tester 110b, the pattern generator 112a, or the digital synchronization controlling unit 108 based on the predetermined hardware set-up. Accordingly, the testing apparatus 100 in this embodiment can operate the arbitrary waveform adjustor 110a, the phase characteristics tester 110b, and the pattern generator 112a in a desired order based on the testing program where the operation order of the arbitrary waveform adjustor 110a, the phase characteristics tester 110b, and the pattern generator 112a is not determined.

Figure 13:
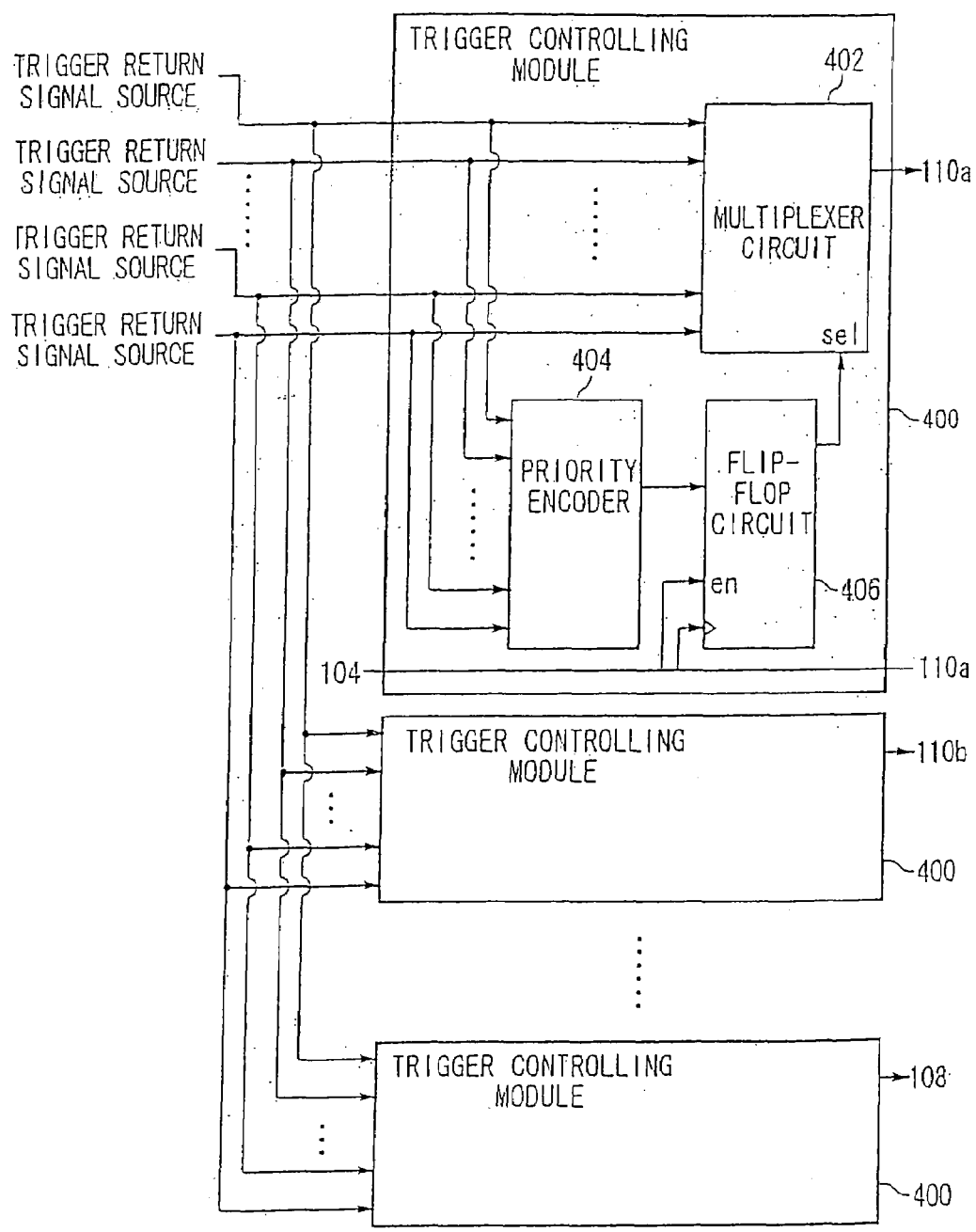
FIG. 13 shows an example of the configuration of a trigger matrix 206 related to this embodiment.

FIG. 13 shows an example of the configuration of the trigger matrix 206 related to this embodiment. The trigger matrix 206 includes a plurality of trigger controlling modules 400. Each of the trigger controlling modules 400 includes a multiplexer circuit 402, a priority encoder 404, and a flip-flop circuit 406. Each of the trigger controlling modules 400 is coupled to the plurality of analog testing modules 110 respectively such as the arbitrary waveform adjustor 110a and the phase characteristics tester 110b, and supplies the trigger signal to each of the plurality of analog testing modules in response to the supplied trigger return signal.

First, the hardware set-up of the trigger controlling module 400 before the test of the device under test 120 begins will be described. When a status signal is supplied to the trigger controlling module 400 by at least one of trigger return signal sources based on an instruction of the site controlling apparatus 104, the priority of encoder 404 receives signals supplied from the plurality of trigger return signals via a plurality of interfaces respectively, and calculates and supplies the status information indicating which trigger return signal source supplies the status signal to the flip-flop circuit 406. And, when an enable signal is supplied to the flip-flop circuit 406 by the arbitrary waveform adjustor 110a based on an instruction of the site controlling unit 104, and a set-up request signal is supplied from the site controlling unit 104 to the flip-flop circuit 406, the flip-flop circuit 406 holds the status information being supplied from the priority encoder 404 when the set-up request signal is supplied as a select signal for controlling the multiplexer circuit 402 to select the control signal based on the set-up request signal. Accordingly, the hardware set-up of the trigger controlling module 400 is performed, and the connections of the input and the output are determined. Here, as the trigger return signal sources, there is the digital synchronization controlling unit 108, the arbitrary waveform adjustor 110a, the phase characteristics tester 110b, the performance board, etc.

Next, the operation of the trigger controlling module 400 during the test of the device under test 120 will be described. The flip-flop circuit 406 supplies the status information held before the start of the test as described above to the multiplexer circuit 402 as the select signal. And, the multiplexer circuit 402 is functioning as the trigger return signal receiving means of the present invention, and obtains a plurality of trigger return signals supplied from each of the plurality of trigger return signal sources based on an instruction of the site controlling apparatus 104. And, the multiplexer circuit 402 is functioning as the trigger signal supplying means of the present invention, and selects the trigger return signal obtained from each of the trigger return signal sources, a plurality of trigger return signals, the digital synchronization controlling unit 108 or the phase characteristics tester 110b based on the select signal supplied from the flip-flop circuit 406, and supplies it to the arbitrary waveform adjustor 110a as the trigger signal.

According to the trigger controlling module 400 related to this embodiment, before the start of the test of device under test 120, the priority encoder 404 generates status information, and the flip-flop circuit 406 holds it as the select signal, whereby the hardware set-up of the trigger controlling module 400 is performed, and the test can be performed by properly selecting the trigger signal source in response to the arbitrary waveform adjustor 110a and the phase characteristics tester 110b.

Although the present invention has been described by way of exemplary embodiments, it should be understood that those skilled in the art might make many changes arid substitutions without departing from the spirit and the scope of the present invention which is defined only by the appended claims.

The invention claimed is:

1. A testing apparatus which comprises a plurality of testing module slots to which different types of testing modules for testing a device under test are optionally mounted, comprising at least one synchronization controlling unit for controlling the operation of a first testing module and a second testing module among said plurality of testing modules, said synchronization controlling unit comprising:

operation order holding means for holding information indicating that a test operation by the first testing module should be performed before a test operation by the second testing module;

trigger return signal receiving means for receiving a trigger return signal from said first testing module, said trigger return signal indicating that said first testing module has completed said test operation thereof, when said test operation of said first testing module has been completed;

trigger signal supplying means for supplying a trigger signal to said second testing module, said trigger signal indicating that said second testing module should start said test operation thereof, when said trigger return signal receiving means receives said trigger return signal;

an expanded trigger input terminal; and an expanded trigger output terminal.

2. A testing apparatus as claimed in claim 1, wherein said testing apparatus comprises a first and a second synchronization controlling units, and wherein the expanded trigger output terminal of the first synchronization controlling unit is connected to the expanded trigger input terminal of the second synchronization controlling unit.

3. A testing apparatus as claimed in claim 1, wherein said synchronization controlling unit is mounted on one of the plurality of testing module slots.

* * * * *